US009666634B2

(12) United States Patent
Tian et al.

(10) Patent No.: US 9,666,634 B2
(45) Date of Patent: May 30, 2017

(54) IMAGE SENSORS EMPLOYING SENSITIZED SEMICONDUCTOR DIODES

(71) Applicant: InVisage Technologies, Inc., Menlo Park, CA (US)

(72) Inventors: Hui Tian, Cupertino, CA (US); Igor Constantin Ivanov, Danville, CA (US); Edward Hartley Sargent, Toronto (CA)

(73) Assignee: InVisage Technologies, Inc., Newark, CA (US)

( * ) Notice: Subject to any disclaimer, the term of this patent is extended or adjusted under 35 U.S.C. 154(b) by 0 days.

(21) Appl. No.: 15/066,452

(22) Filed: Mar. 10, 2016

(65) Prior Publication Data

US 2016/0190201 A1   Jun. 30, 2016

Related U.S. Application Data

(63) Continuation of application No. 14/470,384, filed on Aug. 27, 2014, now Pat. No. 9,293,487, which is a
(Continued)

(51) Int. Cl.
*H01L 27/146* (2006.01)
*H04N 9/04* (2006.01)

(52) U.S. Cl.
CPC .. *H01L 27/14643* (2013.01); *H01L 27/14603* (2013.01); *H01L 27/14609* (2013.01);
(Continued)

(58) Field of Classification Search
CPC ............. G01N 15/1031; G01N 33/588; H01L 27/14643; H01L 27/14603; H04N 9/045
(Continued)

(56) References Cited

U.S. PATENT DOCUMENTS

| 8,222,709 B2 | 7/2012 | Oike et al. |
| 8,354,693 B2 | 1/2013 | Mori et al. |

(Continued)

FOREIGN PATENT DOCUMENTS

| JP | 5812481 A | 1/1983 |
| JP | 5848578 A | 3/1983 |

(Continued)

OTHER PUBLICATIONS

"U.S. Appl. No. 13/051,320, Non Final Office Action mailed Dec. 16, 2013", 10 pgs.

(Continued)

*Primary Examiner* — Seung C Sohn
(74) *Attorney, Agent, or Firm* — Schwegman Lundberg & Woessner, P.A.

(57) ABSTRACT

In various example embodiments, the inventive subject matter is an image sensor and methods of formation of image sensors. In an embodiment, the image sensor comprises a semiconductor substrate and a plurality of pixel regions. Each of the pixel regions includes an optically sensitive material over the substrate with the optically sensitive material positioned to receive light. A pixel circuit for each pixel region is also included in the sensor. Each pixel circuit comprises a charge store formed on the semiconductor substrate and a read out circuit. A non-metallic contact region is between the charge store and the optically sensitive material of the respective pixel region, the charge store being in electrical communication with the optically sensitive material of the respective pixel region through the non-metallic contact region.

20 Claims, 19 Drawing Sheets

Related U.S. Application Data continuation of application No. 13/051,320, filed on Mar. 18, 2011, now Pat. No. 8,822,897.

(60) Provisional application No. 61/315,843, filed on Mar. 19, 2010.

(52) U.S. Cl.
CPC .. *H01L 27/14632* (2013.01); *H01L 27/14636* (2013.01); *H04N 9/045* (2013.01); *H01L 27/14621* (2013.01)

(58) Field of Classification Search
USPC .................. 250/208.1, 214.1; 257/290–292
See application file for complete search history.

(56) References Cited

U.S. PATENT DOCUMENTS

| | | | |
|---|---|---|---|
| 8,822,897 B2 | 9/2014 | Tian et al. | |
| 9,293,487 B2 | 3/2016 | Tian et al. | |
| 2005/0056901 A1* | 3/2005 | Kuriyama | H01L 27/14621 257/428 |
| 2005/0072906 A1* | 4/2005 | Dobashi | H01L 27/14627 250/208.1 |
| 2005/0236553 A1* | 10/2005 | Noto | H01L 27/14621 250/208.1 |
| 2005/0263676 A1* | 12/2005 | Jeon | H01L 27/14603 250/208.1 |
| 2006/0131579 A1 | 6/2006 | Rothman | |
| 2007/0045511 A1 | 3/2007 | Lee et al. | |
| 2008/0128595 A1 | 6/2008 | Kiesel et al. | |
| 2008/0191209 A1 | 8/2008 | Moon | |
| 2008/0265295 A1 | 10/2008 | Brady | |
| 2009/0021612 A1 | 1/2009 | Hamilton, Jr. et al. | |
| 2009/0065824 A1 | 3/2009 | Hwang | |
| 2009/0256156 A1* | 10/2009 | Hsieh | H01L 27/14609 257/72 |
| 2010/0038523 A1 | 2/2010 | Venezia et al. | |
| 2010/0253833 A1 | 10/2010 | Deever et al. | |
| 2010/0265370 A1 | 10/2010 | Kumar et al. | |
| 2011/0075008 A1 | 3/2011 | Border et al. | |
| 2011/0101205 A1 | 5/2011 | Tian et al. | |
| 2011/0226934 A1 | 9/2011 | Tian et al. | |
| 2013/0113967 A1 | 5/2013 | Wang | |
| 2014/0367823 A1 | 12/2014 | Tian et al. | |
| 2015/0357360 A1 | 12/2015 | Tian et al. | |

FOREIGN PATENT DOCUMENTS

| | | |
|---|---|---|
| JP | 06061467 A | 3/1994 |
| JP | 5732683 A | 2/1998 |
| JP | 2004512686 A | 4/2004 |
| JP | 2005517300 A | 6/2005 |
| JP | 2007151069 A | 6/2007 |
| JP | 2008305994 A | 12/2008 |
| JP | 2009509129 A | 3/2009 |
| JP | 2010008186 A | 1/2010 |
| JP | 2013527597 A | 6/2013 |
| KR | 101605424 B1 | 3/2016 |
| TW | 200901456 A | 1/2009 |
| TW | 200915558 A | 4/2009 |
| TW | 201203528 A | 1/2012 |
| TW | I557887 B | 11/2016 |
| WO | WO-0233755 A2 | 4/2002 |
| WO | WO-03067663 A1 | 8/2003 |
| WO | WO-2007102051 A2 | 9/2007 |
| WO | WO-2011116268 A1 | 9/2011 |
| WO | WO-2011146635 A1 | 11/2011 |
| WO | WO-2015191594 A1 | 12/2015 |

OTHER PUBLICATIONS

"U.S. Appl. No. 13/051,320, Notice of Allowance mailed May 6, 2014", 7 pgs.
"U.S. Appl. No. 13/051,320, Response filed Mar. 14, 2014 to Non Final Office Action mailed Dec. 16, 2014", 16 pgs.
"U.S. Appl. No. 13/051,320, Response filed Jul. 16, 2013 to Restriction Requirement mailed May 17, 2013", 14 pgs.
"U.S. Appl. No. 13/051,320, Restriction Requirement mailed May 17, 2013", 4 pgs.
"U.S. Appl. No. 14/470,384, Non Final Office Action mailed Jan. 2, 2015", 5 pgs.
"U.S. Appl. No. 14/470,384, Notice of Allowance mailed Jan. 15, 2016", 9 pgs.
"U.S. Appl. No. 14/470,384, Notice of Allowance mailed Sep. 16, 2015", 8 pgs.
"U.S. Appl. No. 14/470,384, Response filed Jul. 1, 2015 to Non Final Office Action mailed Jan. 2, 2015", 9 pgs.
"International Application Serial No. PCT/US2011/028962, International Search Report mailed Jun. 3, 2011", 3 pgs.
"International Application Serial No. PCT/US2011/028962, Preliminary Report on Patentability mailed Oct. 4, 2012", 8 pgs.
"International Application Serial No. PCT/US2011/028962, Written Opinion mailed Jun. 3, 2011", 6 pgs.
"Japanese Application Serial No. 2013-501331, Decision of Final Rejection mailed Jul. 1, 2015", w/ English Translation, 10 pgs.
"Japanese Application Serial No. 2013-501331, Office Action mailed Feb. 5, 2016", 10 pgs w/ English Claims.
"Japanese Application Serial No. 2013-501331, Office Action mailed Sep. 27, 2016", w/ English translation, 10 pgs.
"Japanese Application Serial No. 2013-501331, Office Action mailed Oct. 1, 2014", 22 pgs.
"Korean Application Serial No. 10-2012-7027192, Amendment filed Aug. 7, 2014", 12 pgs.
"Korean Application Serial No. 10-2012-7027192, Office Action mailed Nov. 17, 2014", 26 pgs.
"Korean Application Serial No. 10-2012-7027192, Response filed May 18, 2015 to Office Action mailed Nov. 17, 2014", 20 pgs.
"Korean Application Serial No. 10-2015-7012982, Notice of Preliminary Rejection mailed Dec. 4, 2015", With English translation, 13 pgs.
"Korean Application Serial No. 10-2015-7012982, Response filed Jun. 7, 2016 to Notice of Preliminary Rejection mailed Dec. 4, 2015", with English Claims, 19 pgs.
"Taiwanese Application Serial No. 100109336, Office Action mailed Sep. 18, 2015", with English Claims, 18 pgs.
"Taiwanese Application Serial No. 100109336, Response filed Mar. 21, 2016 to Office Action mailed Sep. 18, 2015", (English Translation of Claims), 117 pgs.

* cited by examiner

IMAGE SENSORS EMPLOYING SENSITIZED SEMICONDUCTOR DIODES

CROSS-REFERENCE TO RELATED APPLICATIONS

This application is a continuation of and claims the benefit of priority to U.S. patent application Ser. No. 14/470,384, filed Aug. 27, 2014, which is is a continuation of and claims the benefit of priority to U.S. patent application Ser. No. 13/051,320, filed Mar. 18, 2011, which application claims the benefit of priority under 35 U.S.C. 119(e) to U.S. Provisional Application No. 61/315,843, filed Mar. 19, 2010, which applications are hereby incorporated by reference in their entireties. Each patent, patent application, and/or publication mentioned in this specification is hereby incorporated by reference in its entirety to the same extent as if each individual patent, patent application, and/or publication was specifically and individually indicated to be incorporated by reference.

TECHNICAL FIELD

The present invention generally relates to optical and electronic devices, systems and methods that include optically sensitive material, such as nanocrystals or other optically sensitive material, and methods of making and using the devices and systems.

BRIEF DESCRIPTION OF FIGURES

The systems and methods described herein may be understood by reference to the following figures.

Figure 1:
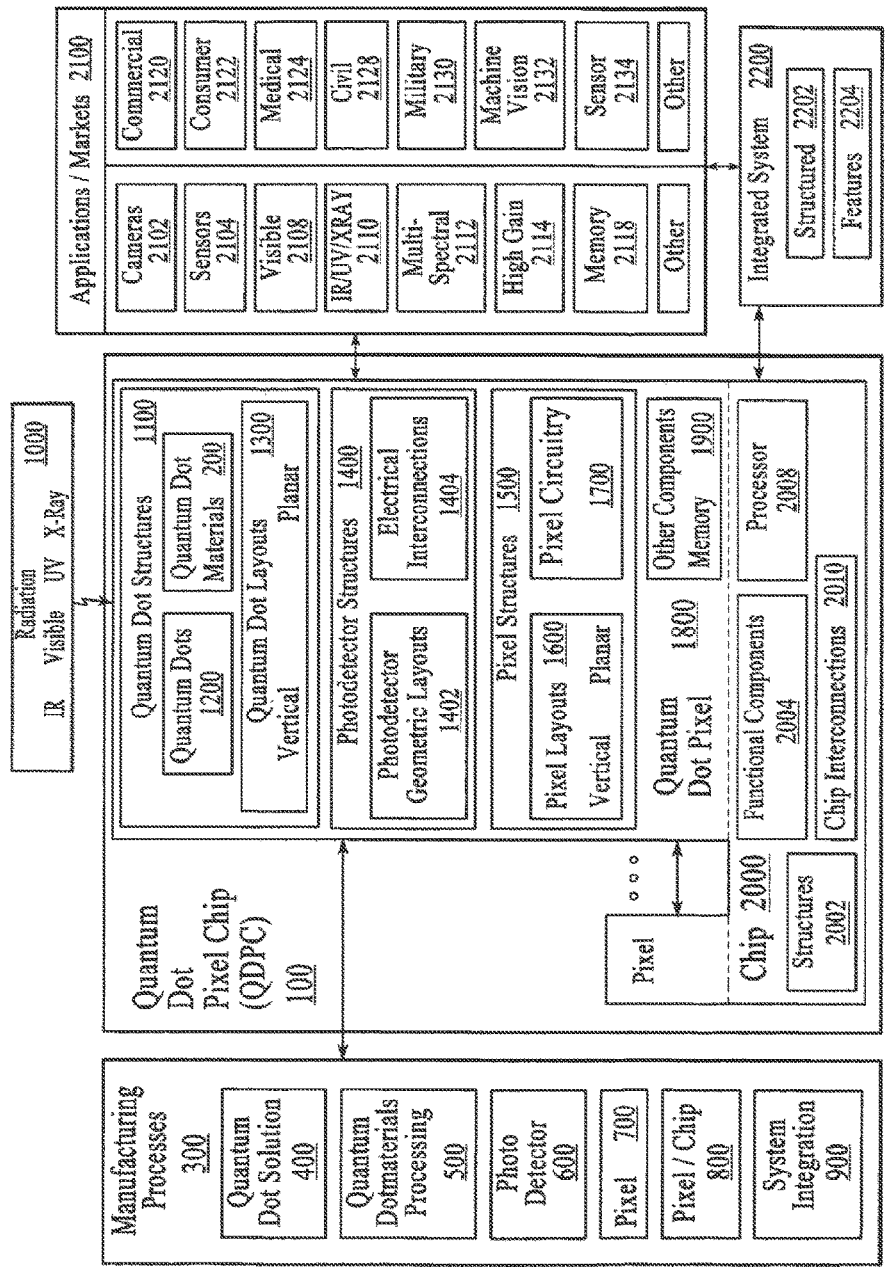
FIG. 1 shows overall structure and areas according to an embodiment.

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

Embodiments include an image sensor comprising a semiconductor substrate; a plurality of pixel regions, each pixel region comprising an optically sensitive material over the substrate, the optically sensitive material positioned to receive light; a pixel circuit for each pixel region, each pixel circuit comprising a charge store formed on the semiconductor substrate and a read out circuit; and a non-metallic contact region between the charge store and the optically sensitive material of the respective pixel region, wherein the charge store is in electrical communication with the optically sensitive material of the respective pixel region through the non-metallic contact region.

Embodiments include an image sensor wherein the charge store comprises a doped region of the semiconductor substrate.

Embodiments include an image sensor wherein the charge store comprises an n-type region of the semiconductor substrate.

Embodiments include an image sensor wherein the charge store comprises a diode.

Embodiments include and image sensor wherein the charge store comprises a n-type silicon diode.

Embodiments include an image sensor wherein the charge store comprises a pinned diode.

Embodiments include an image sensor wherein the pinned diode comprises a p-type layer of the optically sensitive material over an n-type region of the semiconductor substrate.

Embodiments include an image sensor wherein the optically sensitive material comprises a p-type semiconductor material.

Embodiments include an image sensor wherein the non-metallic contact region comprises a pn junction.

Embodiments include an image sensor wherein the non-metallic contact region comprises a heterojunction.

Embodiments include an image sensor wherein the optically sensitive material is in direct electrical communication with the charge store.

Embodiments include an image sensor wherein the optically sensitive material is in direct contact with the charge store.

Embodiments include an image sensor wherein the optically sensitive material forms a passivation layer over the charge store.

Embodiments include an image sensor wherein the optically sensitive material forms a hole accumulation layer over the charge store.

Embodiments include an image sensor wherein the charge store comprises a pinned diode, wherein the pinned diode comprises a p-type layer of the optically sensitive material over an n-type region of the semiconductor substrate.

Embodiments include an image sensor wherein the optically sensitive material absorbs light at the wavelength being imaged.

Embodiments include an image sensor wherein the optically sensitive material substantially shields the charge store from the light incident on the optically sensitive layer.

Embodiments include an image sensor wherein the non-metallic contact region comprises at least one layer of material between the optically sensitive material and the charge store.

Embodiments include an image sensor wherein the layer of material comprises a p-type semiconductor material.

Embodiments include an image sensor wherein the layer of material comprises a p-type silicon layer.

Embodiments include an image sensor wherein the layer of material comprises a material selected from the group consisting of a semiconductor material, a polymer material and an organic material.

Embodiments include an image sensor wherein the layer of material provides a non-metallic conductive path for the flow of charge between the optically sensitive material and the charge store.

Embodiments include an image sensor wherein at least one layer of material above the charge store substantially shields the charge store from the light incident on the optically sensitive layer.

Embodiments include an image sensor wherein the pixel circuit comprises at least one transistor formed on a first side of the semiconductor substrate.

Embodiments include an image sensor wherein the semiconductor substrate comprises metal interconnect on a first side of the semiconductor substrate.

Embodiments include an image sensor wherein the charge store is formed on the first side of the semiconductor substrate.

Embodiments include an image sensor wherein the optically sensitive material is positioned over the first side of the semiconductor substrate.

Embodiments include an image sensor wherein an opening is formed in metal interconnect layers of the semiconductor substrate to expose the charge store and the optically sensitive material interfaces with the charge store through the opening.

Embodiments include an image sensor wherein at least a portion of the optically sensitive material is positioned in the opening.

Embodiments include an image sensor wherein at least one additional layer of non-metallic material is included in the opening. Embodiments include an image sensor wherein the charge store is formed on a second side of the semiconductor substrate.

Embodiments include an image sensor wherein the optically sensitive material is positioned over the second side of the semiconductor substrate.

Embodiments include an image sensor wherein at least one electrode is proximate the optically sensitive material of each pixel region.

Embodiments include an image sensor wherein the electrode comprises a transparent electrode positioned over the optically sensitive material of the respective pixel region.

Embodiments include an image sensor wherein the electrode is a lateral electrode proximate the optically sensitive material of the respective pixel region.

Embodiments include an image sensor wherein the electrode is a grid electrode around the optically sensitive material of the respective pixel region.

Embodiments include an image sensor wherein the electrode is in electrical communication with a metal interconnect layer of the semiconductor substrate.

Embodiments include an image sensor wherein the electrode is a common electrode for the plurality of pixel regions.

Embodiments include an image sensor wherein the electrode is configured to provide a bias to the optically sensitive material.

Embodiments include an image sensor wherein the electrode is grounded.

Embodiments include an image sensor wherein the electrode is configured to provide a voltage lower than a depletion voltage of a pinned diode forming the charge store.

Embodiments include an image sensor wherein the pixel circuit further comprises a sense node.

Embodiments include an image sensor wherein the sense node comprises a doped region of the semiconductor substrate.

Embodiments include an image sensor comprising a charge transfer transistor between the sense node that the charge store for selectively transferring charge between the sense node and the charge store when a transfer signal is applied to the gate of the charge transfer transistor.

Embodiments include an image sensor wherein the read out circuit comprises a source follower transistor and a row select transistor for selectively coupling the source follower transistor to a column read out line.

Embodiments include an image sensor wherein the pixel circuit further comprises a reset transistor between the sense node and a reference potential for selectively resetting the voltage of the sense node when a reset signal is applied to the gate of the reset transistor.

Embodiments include an image sensor wherein there are four transistors included in the pixel circuit.

Embodiments include an image sensor wherein the pixel circuit is configured to integrate charge from the optically sensitive material into the charge store during an integration period of time, wherein the charge is transferred from the optically sensitive material to the charge store through the non-metallic contact region.

Embodiments include an image sensor wherein the charge transferred to the charge store is based on intensity of the light absorbed by the optically sensitive material of the respective pixel region over an integration period of time.

Embodiments include an image sensor wherein the pixel circuit is configured to provide a read out signal using correlated double sampling.

Embodiments include an image sensor wherein the pixel circuit is configured to perform a first reset, wherein the sense node is reset to the reference potential and the charge store is reset to a depletion voltage of a pinned diode forming the charge store.

Embodiments include an image sensor reset transistor and the charge transfer transistor are open during the first reset.

Embodiments include an image sensor wherein the charge transfer transistor is closed during the integration period of time.

Embodiments include an image sensor wherein the electrode applies a voltage difference across the optically sensitive material during the integration period of time.

Embodiments include an image sensor wherein the pixel circuit is configured to perform a second reset of the sense node prior to read out, wherein the charge transfer transistor is closed and the reset transistor is open during the second reset.

Embodiments include an image sensor wherein the pixel circuit is configured to transfer charge from the charge store to the sense node for read out after the second reset, wherein the charge transfer transistor is open and the reset transistor is closed during the transfer of charge from the charge store for read out.

Embodiments include an image sensor wherein the optically sensitive material comprises monodispersed nanocrystals.

Embodiments include an image sensor wherein the optically sensitive material comprises a continuous film of interconnected nanocrystal particles in contact with the electrode and the charge store for the respective pixel region.

Embodiments include an image sensor wherein the nanocrystal particles comprise a plurality of nanocrystal cores and a shell over the plurality of nanocrystal cores.

Embodiments include an image sensor wherein the plurality of nanocrystal cores is fused.

Embodiments include an image sensor wherein the plurality of nanocrystal cores is electrically interconnected with linker molecules.

Embodiments include an image sensor wherein optical isolation among pixel regions is achieved using a light-blocking layer disposed in the horizontal plane substantially at the boundary between the pixel regions.

Embodiments include an image sensor wherein the light-blocking layer consists of a material from the group Al, TiN, Cu, Ni, Mo, TiOxNy, and W.

Embodiments include an image sensor wherein the light-blocking layer consists of a material whose width is in the range 5 nm-100 nm.

Embodiments include an image sensor wherein the light-blocking layer consists of a material whose width is in the range 5 nm-100 nm.

Embodiments include an image sensor comprising a semiconductor substrate; a plurality of pixel regions, each pixel region comprising an optically sensitive material over the substrate, the optically sensitive material positioned to receive light; and a pinned diode comprising a doped region of the semiconductor substrate and a portion of the optically sensitive material over the doped region.

Embodiments include an image sensor wherein the interface between the optically sensitive material and the doped region forms a pn junction.

Embodiments include an image sensor wherein the interface between the optically sensitive material and the doped region forms a heterojunction.

Embodiments include a semiconductor substrate; a plurality of pixel regions, each pixel region comprising an optically sensitive material over the substrate, the optically sensitive material positioned to receive light; and a diode formed on the semiconductor substrate, wherein the optically sensitive material directly contacts the diode to provide electrical communication between the optically sensitive material and the diode.

Embodiments include an image sensor wherein the interface between the optically sensitive material and the doped region forms a pn junction.

Embodiments include an image sensor wherein the interface between the optically sensitive material and the doped region forms a heterojunction.

Embodiments include a method for read out of an image sensor comprising: providing an optically sensitive material over a semiconductor substrate; exposing the optically sensitive material to light; integrating charge from the optically sensitive material to a charge store formed on the semiconductor substrate through a non-metallic contact region between the optically sensitive material and the charge store.

Embodiments include the method wherein the charge store is a pinned diode.

Embodiments include the method wherein the pinned diode is substantially shielded from light incident on the optically sensitive material.

Embodiments include the method wherein the optically sensitive material is the primary location for the absorption of light to be imaged.

Embodiments include a method for read out of an image sensor comprising: providing an optically sensitive material over a semiconductor substrate; exposing the optically sensitive material to light; performing a first reset to reset a sense node to a reference potential and a pinned diode to a depletion voltage level; isolating the pinned diode from the sense node during an integration period of time; integrating charge from the optically sensitive material to the pinned diode during the integration period of time, wherein the amount of charge integrated during the integration period depends on the intensity of light incident on the photosensitive material; performing a second reset to reset the sense node prior to read out while the sense node is isolated from the pinned diode; transferring charge from the pinned diode to the sense node after the second reset; and reading out a signal from the sense node.

Embodiments include a method wherein the charge is integrated from the optically sensitive material to the pinned diode through a direct interface in the absence of metal interconnect between the optically sensitive material and the pinned diode.

Embodiments include a method wherein the optically sensitive material interfaces with the diode to form a pn junction and the charge is integrated from the optically sensitive material to the diode through the interface.

Image sensors incorporate arrays of photodetectors. These photodetectors sense light, converting it from an optical to an electronic signal.

In the description that follows, each drawing refers to an image sensor, or portions of an image sensor that, in example embodiments, would have one or more of the features, such as (1) direct interface/non-metallic contact region between film and pinned diode, and/or (2) new pixel circuit, and/or (3) new pixel isolation techniques, and/or (4) new backside illumination architecture.

FIG. 1 shows structure of and areas relating to quantum dot pixel chip structures (QDPCs) 100, according to example embodiments. As illustrated in FIG. 1, the QDPC 100 may be adapted as a radiation 1000 receiver where quantum dot structures 1100 are presented to receive the radiation 1000, such as light. The QDPC 100 includes quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. From an electrical viewpoint, the pixel circuitry 1700 may be in communication with other electronics (e.g. chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color.'

In the example embodiment of FIG. 1, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, potential to bin, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure, that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 2:
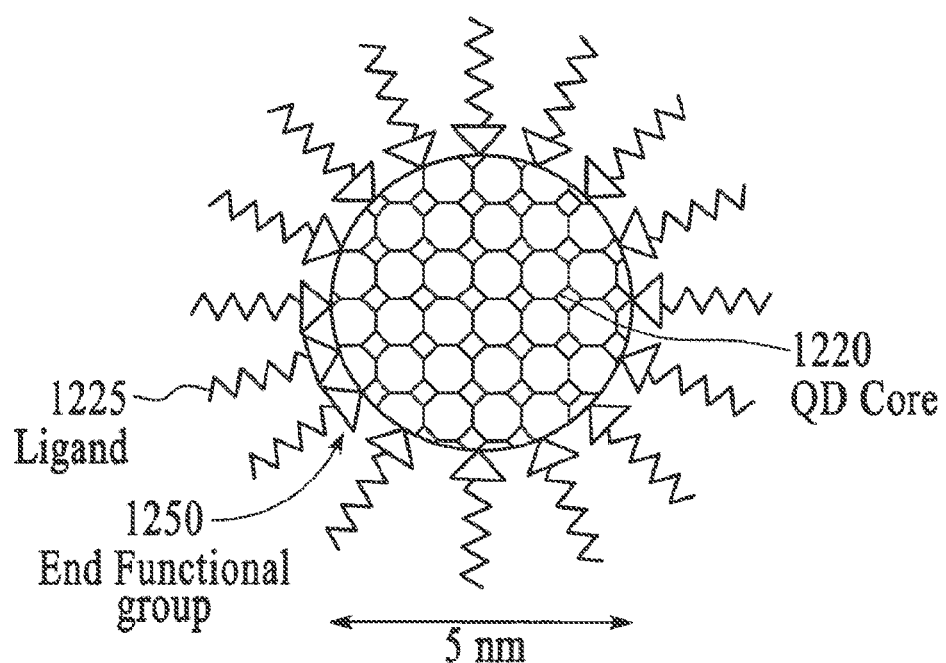
FIG. 2 shows an example of a quantum dot 1200.

FIG. 2 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The mage sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, such as 700×700 nm, or as large as 30 by 30 microns or more or any range subsumed therein.

The photodetector structure 1400 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing my include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure.

In embodiments the chip may have functional components that enable high-speed readout capabilities, which may facilitate the readout of large arrays, such as 5 Mpixels, 6 Mpixels, 8 Mpixels, 12 Mpixels, 24 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. Embodiments include the use of micro-lenses. Embodiments include using smaller process geometries.

In embodiments, pixel size, and thus chip size, may be scaled down without decreasing fill factor. In embodiments, larger process geometries may be used because transistor size, and interconnect line-width, may not obscure pixels since the photodetectors are on the top surface, residing above the interconnect. In embodiments, geometries such as 90 nm, 0.13 um and 0.18 um may be employed without obscuring pixels. In embodiments, small geometries such as 90 nm and below may also be employed, and these may be standard, rather than image-sensor-customized, processes, leading to lower cost. In embodiments, the use of small geometries may be more compatible with high-speed digital signal processing on the same chip. This may lead to faster, cheaper, and/or higher-quality image sensor processing on chip. In embodiments, the use of more advanced geometries for digital signal processing may contribute to lower power consumption for a given degree of image sensor processing functionality.

Figure 5:
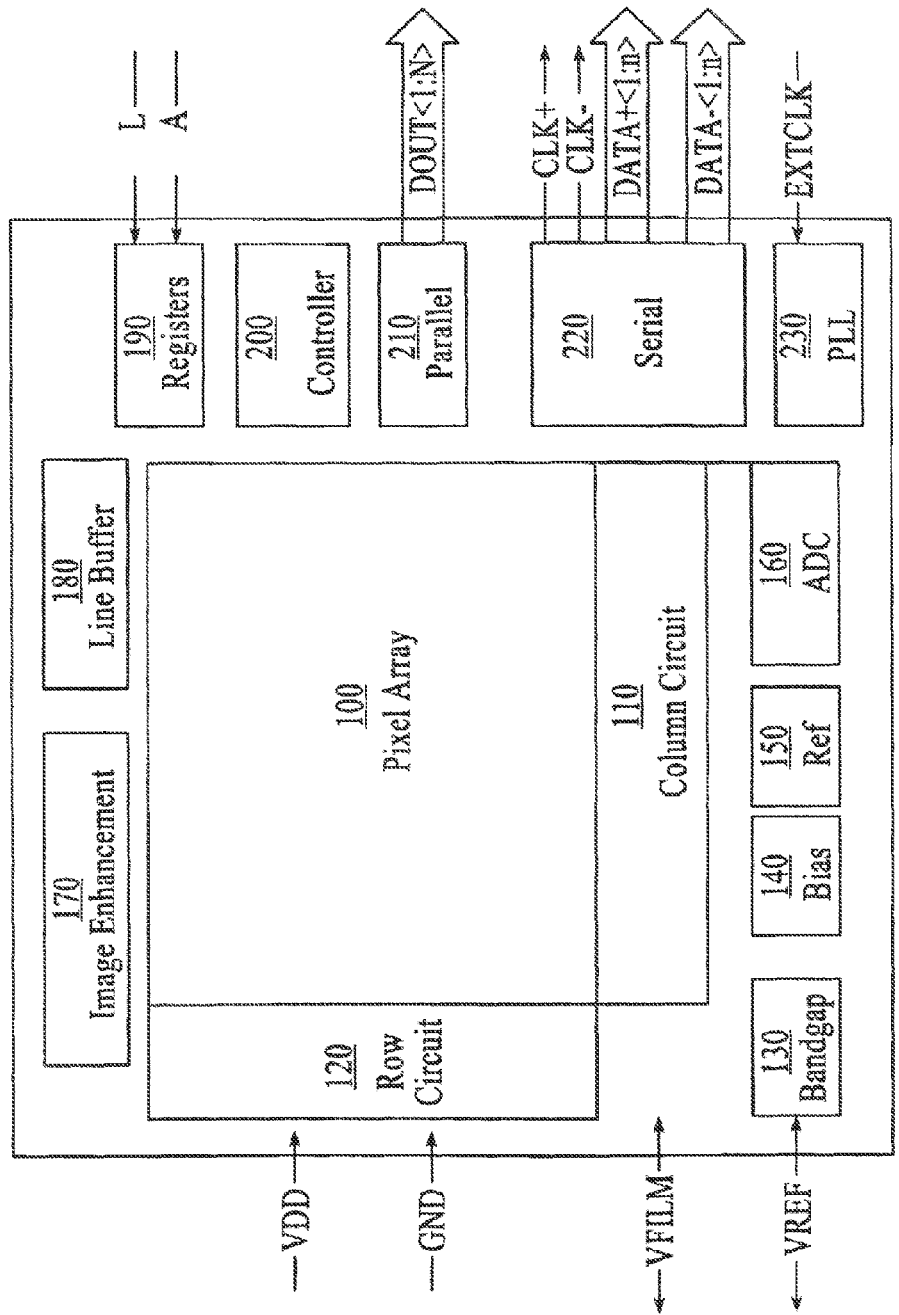
FIG. 5 is a block diagram of an example system configuration that may be used in combination with embodiments described herein.

An example integrated circuit system that can be used in combination with the above photodetectors, pixel regions and pixel circuits will now be described in connection with FIG. 5. FIG. 5 is a block diagram of an image sensor integrated circuit (also referred to as an image sensor chip). The chip includes:

- a pixel array (100) in which incident light is converted into electronic signals, and in which electronic signals are integrated into charge stores whose contents and voltage levels are related to the integrated light incident over the frame period;
- row and column circuits (110 & 120) which are used to reset each pixel, and read the signal related to the contents of each charge store, in order to convey the information related to the integrated light over each pixel over the frame period to the outer periphery of the chip
- analog circuits (130, 140, 150, 160, 230). The pixel electrical signal from the column circuits is fed into the analog-to-digital conver (160) where it is converted into a digital number representing the light level at each pixel. The pixel array and ADC are supported by analog circuits that provide bias and reference levels (130, 140, & 150).
- digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip.
- IO circuits (210 & 220) support both parallel input/output and serial input/output. (210) is a parallel IO interface that outputs every bit of a pixel value simultaneously. (220) is a serial IO interface where every bit of a pixel value is output sequentially.
- a phase-locked loop (230) provides a clock to the whole chip.

In a particular example embodiment, when 0.11 um CMOS technology node is employed, the periodic repeat distance of pixels along the row-axis and along the column-axis may be 700 nm, 900 nm, 1.1 um, 1.2 um, 1.4 um, 1.55 um, 1.75 um, 2.2 um, or larger. The implementation of the smallest of these pixels sizes, especially 700 nm, 900 nm, 1.1 um, and 1.2 um, and 1.4 um, may require transistor sharing among pairs or larger group of adjacent pixels.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack. In the case of conventional CMOS image sensors, this presents an additional constraint in the routing of interconnect. This often reduces the extent to which a transistor, or transistors, can practically be shared. For example, 4:1 sharing is often employed, but higher sharing ratios are not. In contrast, a read-out circuit designed for use with a top-surface optically-sensitive layer can employ 8:1 and 16:1 sharing.

In embodiments, the optically sensitive layer may connect electrically to the read-out circuit beneath without a metal intervening between the optically sensitive layer and the read-out circuit beneath.

Embodiments of QD devices include a QD layer and a custom-designed or pre-fabricated electronic read-out integrated circuit. The QD layer is then formed directly onto the custom-designed or pre-fabricated electronic read-out integrated circuit. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation 1000 on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes.

In embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

Figure 3A:
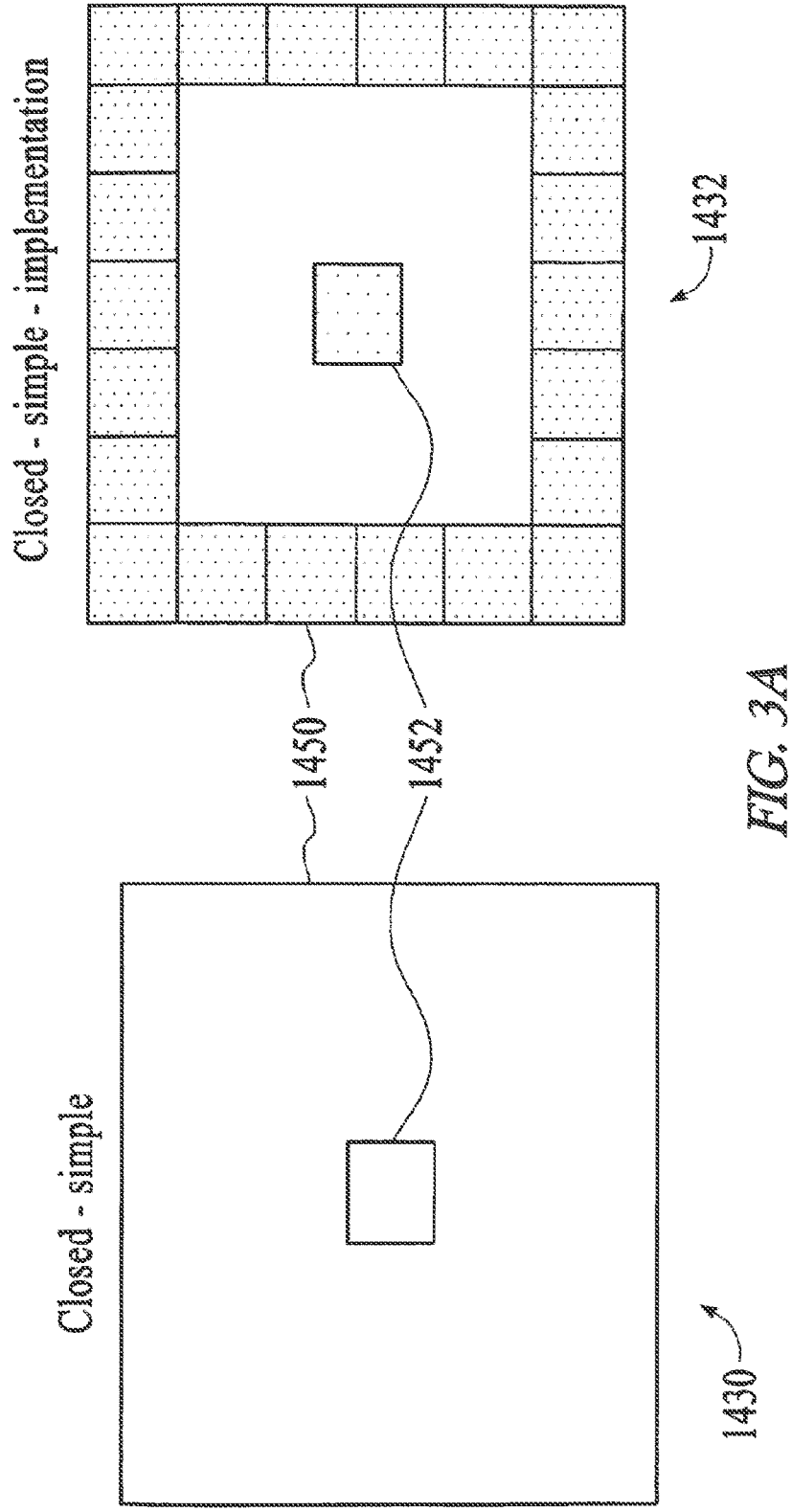
FIG. 3A shows an aspect of a closed simple geometrical arrangement of pixels.
Figure 3B:
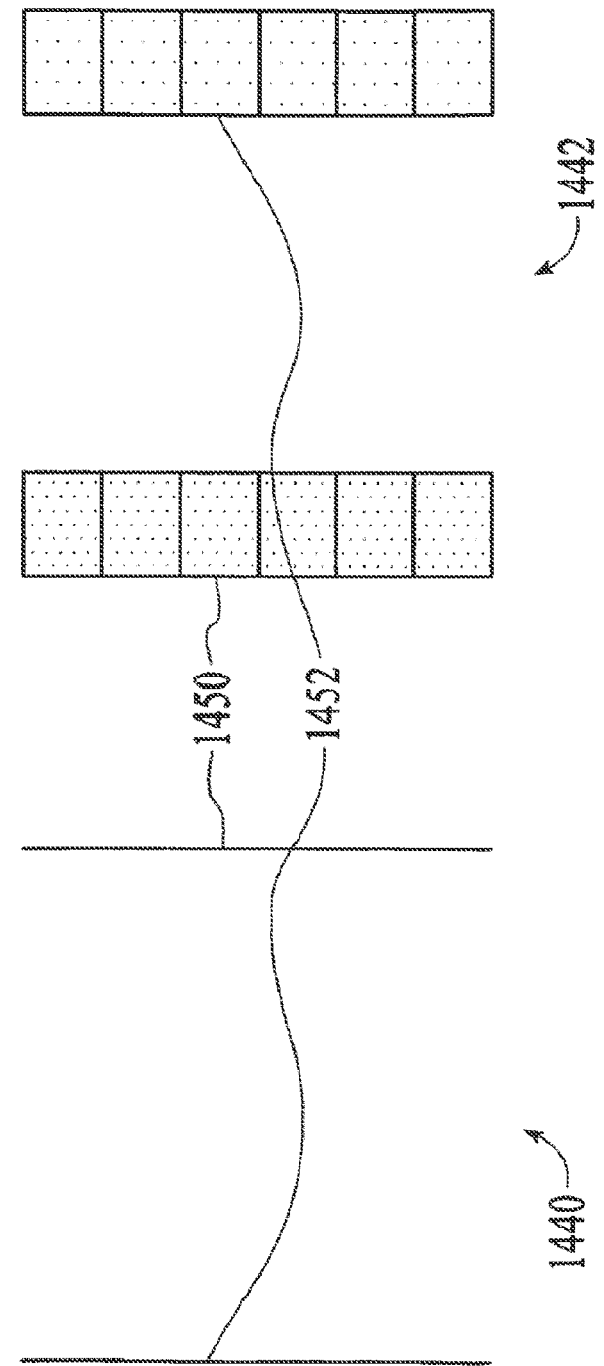
FIG. 3B shows an aspect of an open simple geometrical arrangement of pixels.
Figure 3C:
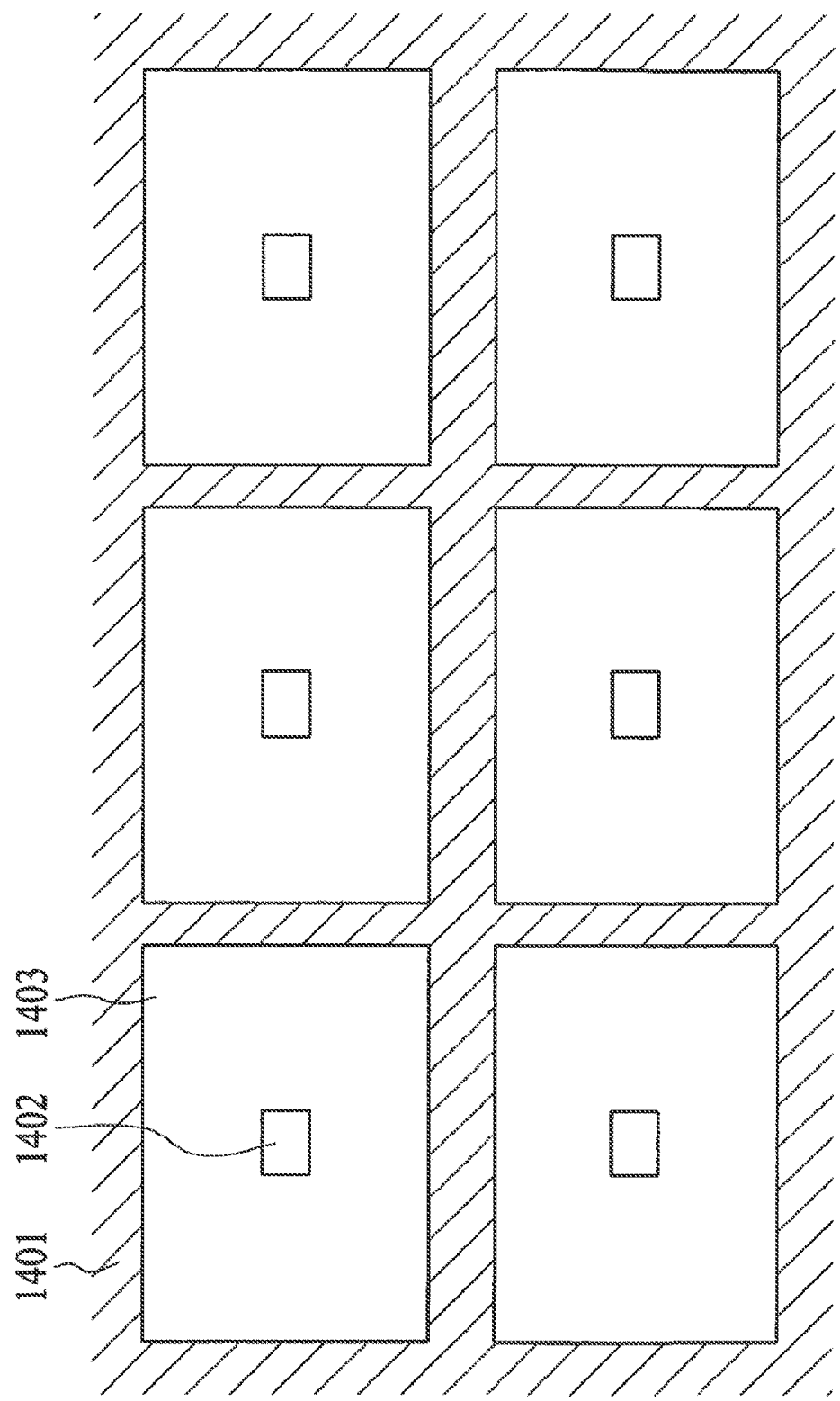
FIG. 3C shows a two-row by three-column sub-region within a generally larger array of top-surface electrodes.

FIG. 3C shows a two-row by three-column sub-region within a generally larger array of top-surface electrodes. The array of electrical contacts provides electrical communication to an overlying layer of optically sensitive material. 1401 represents a common grid of electrodes used to provide one shared contact to the optically sensitive layer. 1402 represents the pixel-electrodes which provide the other contact for electrical communication with the optically sensitive layer. In embodiments, a voltage bias of −2 V may be applied to the common grid 1401, and a voltage of +2.5 V may be applied at the beginning of each integration period to each pixel electrode 1402.

In embodiments, a direct non-metallic contact region (e.g., pn junction contact) may be used instead of a metal interconnect pixel electrode for 1402.

Whereas the common contact 1401 is at a single electrical potential across the array at a given time, the pixel electrodes 1402 may vary in time and space across the array. For example if a circuit is configured such that the bias at 1402 varies in relation to current flowing into or out of 1402, then different electrodes 1402 may be at different biases throughout the progress of the integration period. Region 1403 represents the non-contacting region that lies between 1401 and 1402 within the lateral plane. 1403 is generally an insulating material in order to minimize dark current flowing between 1401 and 1402. 1401 and 1402 may generally consist of different materials. Each may for example be chosen for example from the list: TiN; TiN/Al/TiN; Cu; TaN; Ni; Pt; and from the preceding list there may reside superimposed on one or both contacts a further layer or set of layers chosen from: Pt, alkanethiols, Pd, Ru, Au, ITO, or other conductive or partially conductive materials.

In example embodiments, the pixel electrodes 1402 may consist of a semiconductor, such as silicon, including p-type or n-type silicon, instead of a metal interconnect pixel electrode.

Embodiments described herein may be combined. Example embodiments include a pixel circuit employing a pixel electrode that consists of a semiconductor, such as silicon, instead of a metal. In embodiments a direct connection between film and diode instead of metallic pixel electrodes (either front side or back side) may be formed. Other features described herein may be used in combination with this approach or architecture.

In example embodiments using the above structures, interconnect 1452 may form an electrode in electrical communication with a capacitance, impurity region on the semiconductor substrate or other charge store.

In embodiments, the charge store may be a pinned diode. In embodiments, the charge store may be a pinned diode in communication with an optically sensitive material without an intervening metal being present between the pinned diode and the optically sensitive layer.

In some embodiments, a voltage is applied to the charge store and discharges due to the flow of current across the optically sensitive film over an integration period of time. At the end of the integration period of time, the remaining voltage is sampled to generate a signal corresponding to the intensity of light absorbed by the optically sensitive layer during the integration period. In other embodiments, the pixel region may be biased to cause a voltage to accumulate in a charge store over an integration period of time. At the end of the integration period of time, the voltage may be sampled to generate a signal corresponding to the intensity of light absorbed by the optically sensitive layer during the integration period. In some example embodiments, the bias across the optically sensitive layer may vary over the integration period of time due to the discharge or accumulation of voltage at the charge store. This, in turn, may cause the rate of current flow across the optically sensitive material to also vary over the integration period of time. In addition, the optically sensitive material may be a nanocrystal material with photoconductive gain and the rate of current flow may have a non-linear relationship with the intensity of light absorbed by the optically sensitive layer. As a result, in some embodiments, circuitry may be used to convert the signals from the pixel regions into digital pixel data that has a linear relationship with the intensity of light absorbed by the pixel region over the integration period of time. The non-linear properties of the optically sensitive material can be used to provide a high dynamic range, while circuitry can be used to linearize the signals after they are read in order to provide digital pixel data. Example pixel circuits for read out of signals from pixel regions are described further below.

FIG. 3A represents closed—simple patterns 1430 (e.g., conceptual illustration) and 1432 (e.g., vias used to create photodetector structures). In the closed-simple illustrations 1430-1432 the positively biased electrical interconnect 1452 is provided in the center area of a grounded contained square electrical interconnect 1450. Square electrical interconnect 1450 may be grounded or may be at another reference potential to provide a bias across the optically sensitive material in the pixel region. For example, interconnect 1452 may be biased with a positive voltage and interconnect may be biased with a negative voltage to provide a desired voltage drop across a nanocrystal material in the pixel region between the electrodes. In this configuration, when radiation 1000 to which the layer is responsive falls within the square area a charge is developed and the charge is attracted to and move towards the center positively biased electrical interconnect 1452. If these closed-simple patterns are replicated over an area of the layer, each closed simple pattern forms a portion or a whole pixel where they capture charge associated with incident radiation 1000 that falls on the internal square area. In example embodiments, the electrical interconnect 1450 may be part of a grid that forms a common electrode for an array of pixel regions. Each side of the interconnect 1450 may be shared with the adjacent pixel region to form part of the electrical interconnect around the adjacent pixel. In this embodiment, the voltage on this electrode may be the same for all of the pixel regions (or for sets of adjacent pixel regions) whereas the voltage on the interconnect 1452 varies over an integration period of time based on the light intensity absorbed by the optically sensitive material in the pixel region and can be read out to generate a pixel signal for each pixel region. In example embodiments, interconnect 1450 may form a boundary around the electrical interconnect 1452 for each pixel region. The common electrode may be formed on the same layer as interconnect 1452 and be positioned laterally around the interconnect 1450. In some embodiments, the grid may be formed above or below the layer of optically sensitive material in the pixel region, but the bias on the electrode may still provide a boundary condition around the pixel region to reduce cross over with adjacent pixel regions.

In embodiments, said optically sensitive material may be in direct electrical communication with a pixel electrode, charge store, or pinned diode, without an intervening metal being present between said optically sensitive material and said pixel electrode, charge store, or pinned diode.

FIG. 3B illustrates open simple patterns of electrical interconnects. The open simple patterns do not, generally, form a closed pattern. The open simple pattern does not enclose a charge that is produced as the result of incident radiation 1000 with the area between the positively biased electrical interconnect 1452 and the ground 1450; however, charge developed within the area between the two electrical interconnects will be attracted and move to the positively biased electrical interconnect 1452. An array including separated open simple structures may provide a charge isolation system that may be used to identify a position of incident radiation 1000 and therefore corresponding pixel assignment. As above, electrical interconnect 1450 may be grounded or be at some other reference potential. In some embodiments, electrical interconnect 1450 may be electrically connected with the corresponding electrode of other pixels (for example, through underlying layers of interconnect) so the voltage may be applied across the pixel array. In other embodiments, the interconnect 1450 may extend linearly across multiple pixel regions to form a common electrode across a row or column.

Pixel circuitry that may be used to read out signals from the pixel regions will now be described. As described above, in embodiments, pixel structures 1500 within the QDPC 100 of FIG. 1 may have pixel layouts 1600, where pixel layouts 1600 may have a plurality of layout configurations such as vertical, planar, diagonal, or the like. Pixel structures 1500 may also have embedded pixel circuitry 1700. Pixel structures may also be associated with the electrical interconnections 1404 between the photodetector structures 1400 and pixel circuitry 1700.

In embodiments, quantum dot pixels 1800 within the QDPC 100 of FIG. 1 may have pixel circuitry 1700 that may be embedded or specific to an individual quantum dot pixel 1800, a group of quantum dot pixels 1800, all quantum dot pixels 1800 in an array of pixels, or the like. Different quantum dot pixels 1800 within the array of quantum dot pixels 1800 may have different pixel circuitry 1700, or may have no individual pixel circuitry 1700 at all. In embodiments, the pixel circuitry 1700 may provide a plurality of circuitry, such as for biasing, voltage biasing, current biasing, charge transfer, amplifier, reset, sample and hold, address logic, decoder logic, memory, TRAM cells, flash memory cells, gain, analog summing, analog-to-digital conversion, resistance bridges, or the like. In embodiments, the pixel circuitry 1700 may have a plurality of functions, such as for readout, sampling, correlated double sampling, sub-frame sampling, timing, integration, summing, gain control, automatic gain control, off-set adjustment, calibration, offset adjustment, memory storage, frame buffering, dark current subtraction, binning, or the like. In embodiments, the pixel circuitry 1700 may have electrical connections to other circuitry within the QDPC 100, such as wherein other circuitry located in at least one of a second quantum dot pixel 1800, column circuitry, row circuitry, circuitry within the functional components 2004 of the QDPC 100, or other features 2204 within the integrated system 2200 of the QDPC 100, or the like. The design flexibility associated with pixel circuitry 1700 may provide for a wide range of product improvements and technological innovations.

Pixel circuitry 1700 within the quantum dot pixel 1800 may take a plurality of forms, ranging from no circuitry at all, just interconnecting electrodes, to circuitry that provides functions such as biasing, resetting, buffering, sampling, conversion, addressing, memory, and the like. In embodiments, electronics to condition or process the electrical signal may be located and configured in a plurality of ways. For instance, amplification of the signal may be performed at each pixel, group of pixels, at the end of each column or row, after the signal has been transferred off the array, just prior to when the signal is to be transferred off the chip 2000, or the like. In another instance, analog-to-digital conversion may be provided at each pixel, group of pixels, at the end of each column or row, within the chip's 2000 functional components 2004, after the signal has been transferred off the chip 2000, or the like. In addition, processing at any level may be performed in steps, where a portion of the processing is performed in one location and a second portion of the processing is performed in another location. An example may be the performing analog-to-digital conversion in two steps, say with an analog combining at the pixel 1800 and a higher-rate analog-to-digital conversion as a part of the chip's 2000 functional components 2004.

In embodiments, different electronic configurations may require different levels of post-processing, such as to compensate for the fact that every pixel has its own calibration level associated with each pixel's readout circuit. The QDPC 100 may be able to provide the readout circuitry at each pixel with calibration, gain-control, memory functions, and the like. Because of the QDPC's 100 highly integrated structure, circuitry at the quantum dot pixel 1800 and chip 2000 level may be available, which may enable the QDPC 100 to be an entire image sensor system on a chip. In some embodiments, the QDPC 100 may also be comprised of a quantum dot material 200 in combination with conventional semiconductor technologies, such as CCD and CMOS.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout.

In embodiments, the biasing of the photodetector may be time invariant or time varying. Varying space and time may reduce cross-talk, and enable a shrinking the quantum dot pixel 1800 to a smaller dimension, and require connections between quantum dot pixels 1800. Biasing could be implemented by grounding at the corner of a pixel 1800 and dots in the middle. Biasing may occur only when performing a read, enabling either no field on adjacent pixels 1800, forcing the same bias on adjacent pixels 1800, reading odd columns first then the even columns, and the like. Electrodes and/or biasing may also be shared between pixels 1800. Biasing may be implemented as a voltage source or as a current source. Voltage may be applied across a number of pixels, but then sensed individually, or applied as a single large bias across a string of pixels 1800 on a diagonal. The current source may drive a current down a row, then read it off across the column. This may increase the level of current involved, which may decrease read noise levels.

In embodiments, configuration of the field, by using a biasing scheme or configuration of voltage bias, may produce isolation between pixels. Currently may flow in each pixel so that only electron-hole pairs generated in that volume of pixel flow within that pixel. This may allow electrostatically implemented inter-pixel isolation and cross-talk reduction, without physical separation. This could break the linkage between physical isolation and cross-talk reduction.

In embodiments, the pixel circuitry 1700 may include circuitry for pixel readout. Pixel readout may involve circuitry that reads the signal from the quantum dot material 200 and transfers the signal to other components 1900, chip functional components 2004, to the other features 2204 of the integrated system 2200, or to other off-chip components. Pixel readout circuitry may include quantum dot material 200 interface circuitry, such as 3T and 4T circuits, for example. Pixel readout may involve different ways to readout the pixel signal, ways to transform the pixel signal, voltages applied, and the like. Pixel readout may require a number of metal contacts with the quantum dot material 200, such as 2, 3, 4, 20, or the like. In embodiments, pixel readout may involve direct electrical communication between the optically sensitive material and a pixel electrode, charge store, or pinned diode, without an intervening metal being present between said optically sensitive material and said pixel electrode, charge store, or pinned diode.

These electrical contacts may be custom configured for size, degree of barrier, capacitance, and the like, and may involve other electrical components such a Schottky contact. Pixel readout time may be related to how long the radiation 1000-induced electron-hole pair lasts, such as for milliseconds or microseconds. In embodiments, this time my be associated with quantum dot material 200 process steps, such as changing the persistence, gain, dynamic range, noise efficiency, and the like.

Figure 4A:
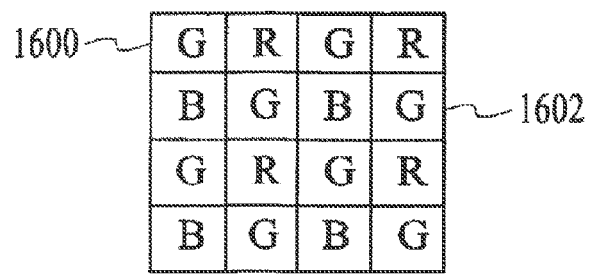
FIG. 4A shows a Bayer filter pattern.
Figure 4B:
FIGS. 4B-4F show examples of some alternative pixel layouts.
Figure 4C:
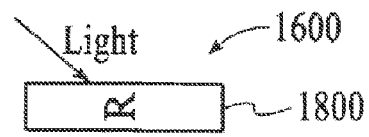
Figure 4D:
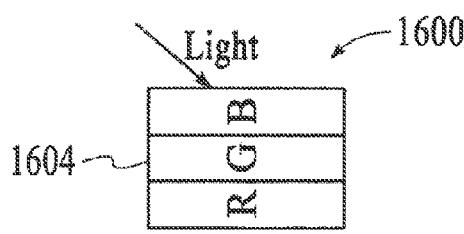
Figure 4E:
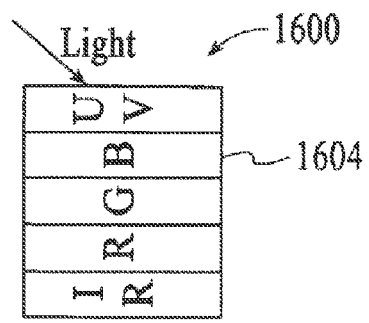
Figure 4F:
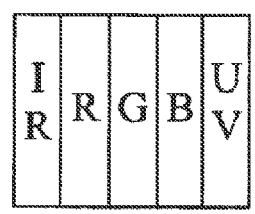
Figure 4G:
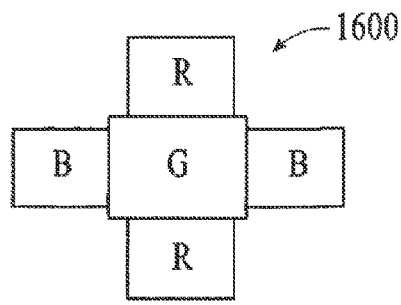
FIGS. 4G-4L show pixels of different sizes, layouts and types used in pixel layouts.
Figure 4H:
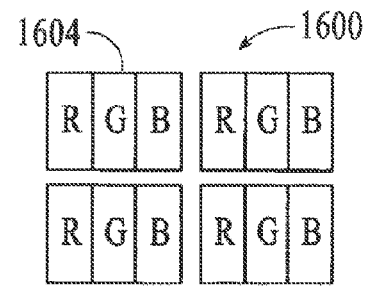
Figure 4I:
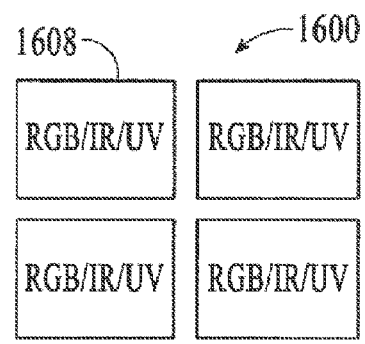
Figure 4J:
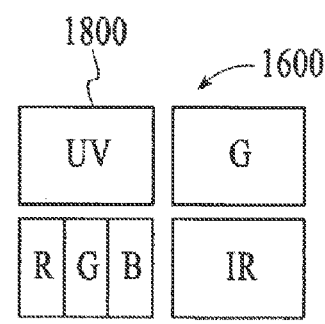
Figure 4K:
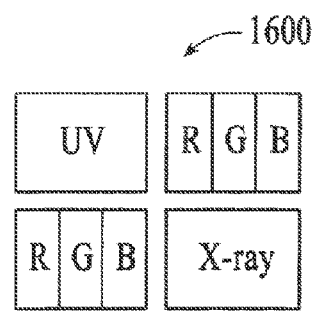
Figure 4L:
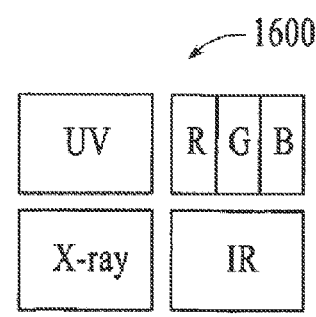
Figure 4M:
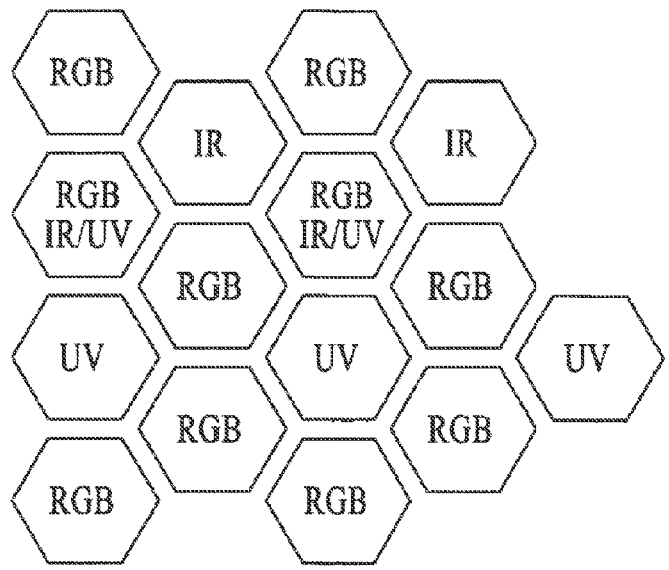
FIG. 4M shows pixel layouts with different shapes, such as hexagons.
Figure 4N:
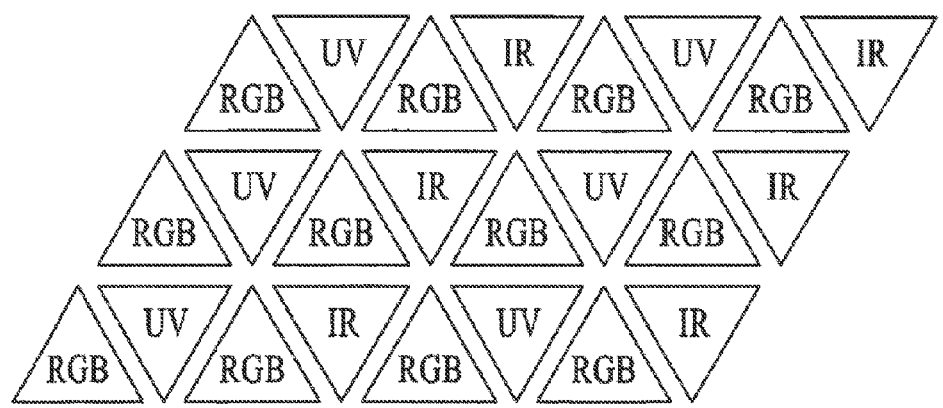
FIG. 4N shows pixel layouts with different shapes, such as triangles.
Figure 4O:
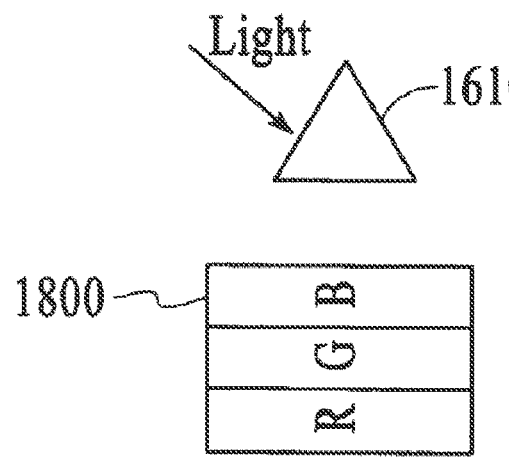
FIG. 4O shows a quantum dot pixel, such as a multi-spectral quantum dot pixel or other pixel, provided in association with an optical element.
Figure 4P:
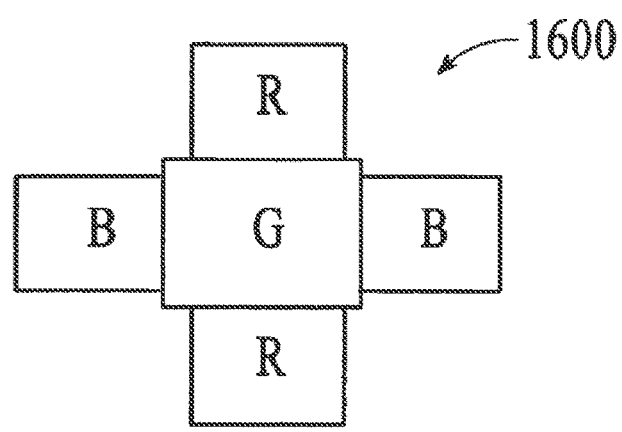
FIG. 4P shows an example of a pixel layout.

The quantum dot pixels 1800 described herein can be arranged in a wide variety of pixel layouts 1600. Referring to FIGS. 4A through 4P for example, a conventional pixel layout 1600, such as the Bayer filter layout 1602, includes groupings of pixels disposed in a plane, which different pixels are sensitive to radiation 1000 of different colors. In conventional image sensors, such as those used in most consumer digital cameras, pixels are rendered sensitive to different colors of radiation 1000 by the use of color filters that are disposed on top of an underlying photodetector, so that the photodetector generates a signal in response to radiation 1000 of a particular range of frequencies, or color. In this configuration, mosaic of different color pixels is referred to often as a color filter array, or color filter mosaic. Although different patterns can be used, the most typical pattern is the Bayer filter pattern 1602 shown in FIG. 4A, where two green pixels, one red pixel and one blue pixel are used, with the green pixels (often referred to as the luminance-sensitive elements) positioned on one diagonal of a square and the red and blue pixels (often referred to as the chrominance-sensitive elements) are positioned on the other diagonal. The use of a second green pixel is used to mimic the human eye's sensitivity to green light. Since the raw output of a sensor array in the Bayer pattern consists of a pattern of signals, each of which corresponds to only one color of light, demosaicing algorithms are used to interpolate red, green and blue values for each point. Different algorithms result in varying quality of the end images. Algorithms may be applied by computing elements on a camera or by separate image processing systems located outside the camera. Quantum dot pixels may be laid out in a traditional color filter system pattern such as the Bayer RGB pattern; however, other patterns may also be used that are better suited to transmitting a greater amount of light, such as Cyan, Magenta, Yellow (CMY). Red, Green, Blue (RGB) color filter systems are generally known to absorb more light than a CMY system. More advanced systems such as RGB Cyan or RGB Clear can also be used in conjunction with Quantum dot pixels.

In one embodiment, the quantum dot pixels 1800 described herein are configured in a mosaic that imitates the Bayer pattern 1602; however, rather than using a color filter, the quantum dot pixels 1800 can be configured to respond to radiation 1000 of a selected color or group of colors, without the use of color filters. Thus, a Bayer pattern 1602 under an embodiment includes a set of green-sensitive, red-sensitive and blue-sensitive quantum dot pixels 1800. Because, in embodiments, no filter is used to filter out different colors of radiation 1000, the amount of radiation 1000 seen by each pixel is much higher.

The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/106,256, entitled "Materials, Systems and Methods for Optoelectronic Devices," filed Apr. 18, 2008 (U.S. Published Patent Application No. 2009/0152664) includes additional descriptions of optoelectronic devices, systems and materials that may be used in connection with example embodiments and is hereby incorporated herein by reference in its entirety. This is an example embodiment only and other embodiments may use different photodetectors and photosensitive materials. For example, embodiments may use silicon or Gallium Arsenide (GaAs) photodetectors.

In example embodiments, an image sensor may be provided with a large number of pixel elements to provide high resolution. For example, an array of 4, 6, 8, 12, 24 or more megapixels may be provided.

The use of such large numbers of pixel elements, combined with the desirability of producing image sensor integrated circuits having small areas such as diagonal dimensions of order ⅓ inch or ¼ inch, entails the use of small individual pixels. Desirable pixel geometries include, for example, 1.75 um linear side dimensions, 1.4 um linear side dimensions, 1.1 um linear side dimensions, 0.9 um linear side dimensions, 0.8 um linear side dimensions, and 0.7 um linear side dimensions.

Embodiments include systems that enable a large fill factor by ensuring that 100%, or nearly 100%, of the area of each pixel includes an optically sensitive material on which incident light of interest in imaging is substantially absorbed. Embodiments include imaging systems that provide a large chief ray acceptance angle. Embodiments include imaging systems that do not required microlenses. Embodiments include imaging systems that are less sensitive to the specific placement of microlenses (microlens shift) in view of their increased fill factor. Embodiments include highly sensitive image sensors. Embodiments include imaging systems in which a first layer proximate the side of optical incidence substantially absorbs incident light; and in which a semiconductor circuit that may included transistors carriers out electronic read-out functions.

Embodiments include optically sensitive materials in which the absorption is strong, i.e., the absorption length is short, such as an absorption length (1/alpha) less than 1 um. Embodiments include image sensor comprising optically sensitive materials in which substantially all light across the visible wavelength spectrum, including out to the red~630 nm, is absorbed in a thickness of optically sensitive material less than approximately 1 micrometer.

Embodiments include image sensors in which the lateral spatial dimensions of the pixels are approximately 2.2 um, 1.75 um, 1.55 um, 1.4 um, 1.1 um, 900 nm, 700 nm, 500 nm; and in which the optically sensitive layer is less than 1 um and is substantially absorbing of light across the spectral range of interest (such as the visible in example embodiments); and in which crosstalk (combined optical and electrical) among adjacent pixels is less than 30%, less than 20%, less than 15%, less than 10%, or less than 5%.

Embodiments include pixel circuits, functioning in combination with an optically sensitive material, in which at least one of dark current, noise, photoresponse nonuniformity, and dark current nonuniformity are minimized through the means of integrating the optically sensitive material with the pixel circuit.

Embodiments include integration and processing approaches that are achieved at low additional cost to manufacture, and can be achieved (or substantially or partially achieved) within a CMOS silicon fabrication foundry.

Figure 6A:
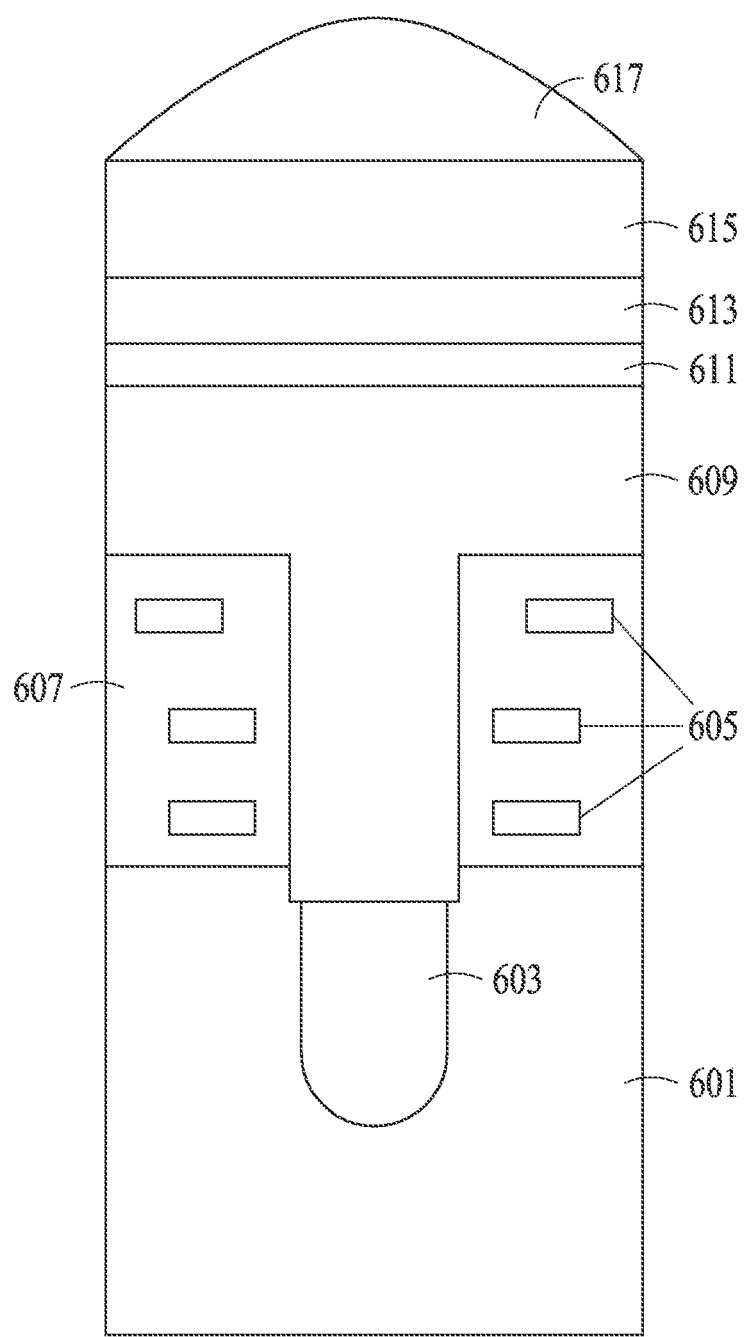
FIGS. 6A, 6B, and 6C present a cross-section of a CMOS image sensor pixel in which an optically sensitive material has been integrated in intimate contact with the silicon diode.

FIG. 6A depicts a front-side illuminated CMOS image sensor pixel in which an optically sensitive material has been integrated in intimate contact with the silicon diode. 601 depicts a silicon substrate on which the image sensor is fabricated. 603 depicts a diode formed in silicon. 605 is the metal interconnect and 607 is the interlayer dielectric stack that serves to provide communication of electrical signals within and across the integrated circuit. 609 is an optically sensitive material that is the primary location for the absorption of light to be imaged. 611 is a transparent electrode that is used to provide electrical biasing of the optically sensitive material to enable photocarrier collection from it. 613 is a passivation layer that may consist of at least one of an organic or polymer encapsulant (such as parylene) or an inorganic such as Si3N4 or a stack incorporating combinations thereof. 613 serves to protect the underlying materials and circuits from environmental influences such as the impact of water or oxygen. 615 is a color filter array layer that is a spectrally-selective transmitter of light used in aid of achieving color imaging. 617 is a microlens that aids in the focusing of light onto 609 the optically sensitive material.

Referring to FIG. 6A, in embodiments, photocurrent generated in 609 the optically sensitive material due to illumination may be transferred, with high efficiency, from the sensitizing material 609 to the diode '2.' Since most incident photons will be absorbed by the sensitizing material '5', the diode 603 no longer needs serve the predominant photodetection role. Instead its principal function is to serve as diode that enables maximal charge transfer and minimal dark current.

Referring to FIG. 6A, the diode 603 may be pinned using the sensitizing material 609 at its surface. The thickness of the sensitizing material 609 may be approximately 500 nm, and may range from 100 nm to 5 um. In embodiments, a p-type sensitizing material 609 may be employed for the light conversion operation and for depleting an n-type silicon diode 603. The junction between the sensitizing material 609 and the silicon diode 603 may be termed a p-n heterojunction in this example.

Referring to FIG. 6A, in the absence of an electrical bias, the n-type silicon 603 and p-type sensitizing material 609 reach equilibrium, i.e., their Fermi levels come into alignment. In an example embodiment, the resultant band-bending produce a built-in potential in the p-type sensitizing material 609 such that a depletion region is formed therein. Upon the application of an appropriate bias within the silicon circuitry (this potential difference applied, for example, via the difference between 611 and 603 in FIG. 6A), the amplitude of this potential is augmented by an applied potential, resulting in a deepening of the depletion region that reaches into the p-type sensitizing material 609. The resultant electrical field results in the extraction of photoelectrons from the sensitizing material 609 into the n+ silicon layer 603. Biasing and doping in the silicon 603 achieve the collection of the photoelectrons from the sensitizing layer 609, and can achieve fully depletion of the n-type silicon 603 under normal bias (such as 3 V, with a normal range of 1V to 5V). Holes are extracted through a second contact (such as 611 in FIG. 6A) to the sensitizing layer 609.

Referring to FIG. 6A, in the case of a vertical device, the contact 611 may be formed atop the sensitizing material 609.

Figure 6B:
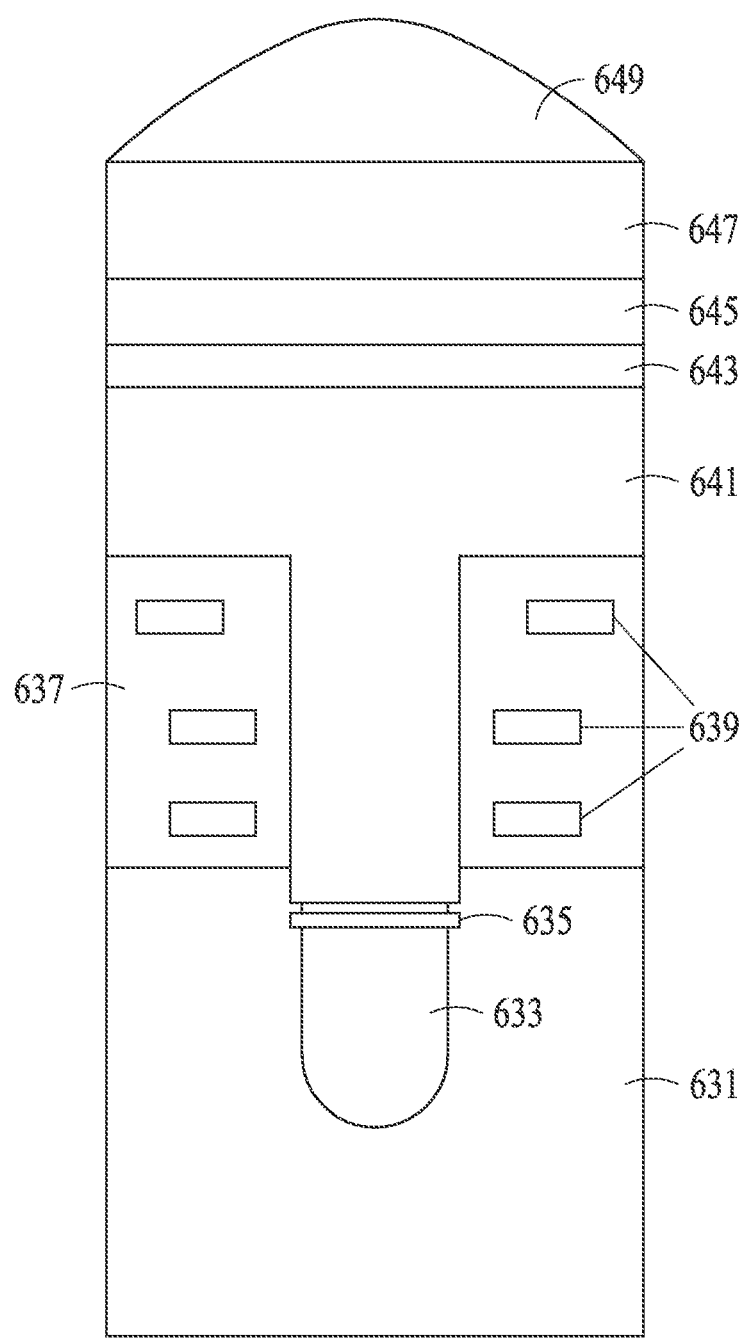

FIG. 6B depicts a front-side illuminated CMOS image sensor pixel in which an optically sensitive material has been integrated in intimate contact with the silicon diode. 631 depicts a silicon substrate on which the image sensor is fabricated. 633 depicts a diode formed in silicon. 639 is the metal interconnect and 637 the interlayer dielectric stack that serves to provide communication of electrical signals within and across the integrated circuit. 641 is an optically sensitive material that is the primary location for the absorption of light to be imaged. 643 is a transparent electrode that is used to provide electrical biasing of the optically sensitive material to enable photocarrier collection from it. 645 is a passivation layer that may consist of at least one of an organic or polymer encapsulant (such as parylene) or an inorganic such as Si3N4 or a stack incorporating combinations thereof. 645 serves to protect the underlying materials and circuits from environmental influences such as the impact of water or oxygen. 647 is a color filter array layer that is a spectrally-selective transmitter of light used in aid of achieving color imaging. 649 is a microlens that aids in the focusing of light onto 641 the optically sensitive material. 635 is a material that resides between the optically sensitive material 641 and the diode 633. 635 may be referred to as an added pinning layer. Example embodiments include a p-type silicon layer. Example embodiments include a non-metallic material such as a semiconductor and/or it could include polymer and/or organic materials. In embodiments, material 635 may provide a path having sufficient conductivity for charge to flow from the optically sensitive material to the diode, but would not be metallic interconnect. In embodiments, 635 serves to passivate the surface of the diode and create the pinned diode in this example embodiment (instead of the optically sensitive material, which would be on top of this additional layer).

Figure 6C:
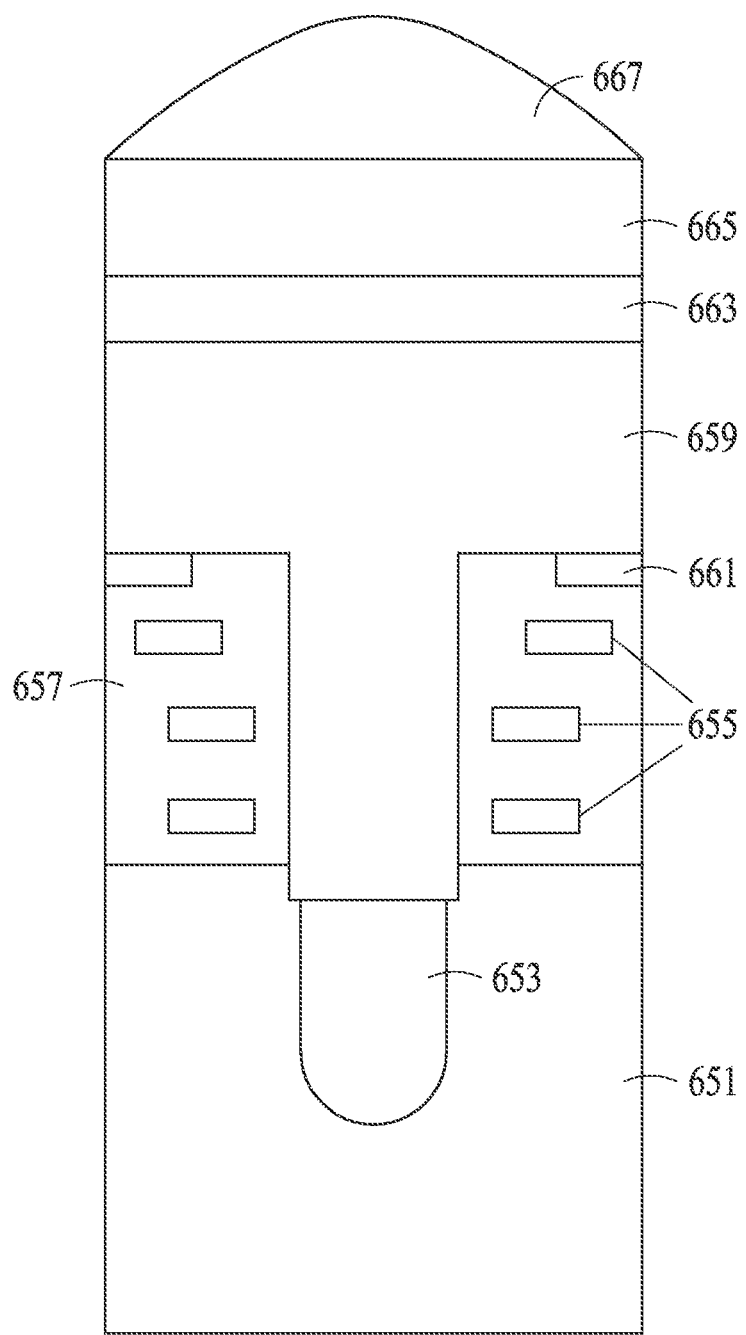

Referring to FIG. 6C, a substantially lateral device may be formed wherein an electrode atop the silicon 661 that resides beneath the sensitizing material 659 may be employed. In embodiments, the electrode 661 may be formed using metals or other conductors such as TiN, TiOxNy, Al, Cu, Ni, Mo, Pt, PtSi, or ITO.

Referring to FIG. 6C, a substantially lateral device may be formed wherein the p-doped silicon 661 that resides beneath the sensitizing material 659 may be employed for biasing.

Example embodiments provide image sensors that use an array of pixel elements to detect an image. The pixel elements may include photosensitive material, also referred to herein as the sensitizing material, corresponding to 609 in FIG. 6A, 641 in FIG. 6B, 659 in FIG. 6C, 709 in FIG. 7A, the filled ellipse in FIG. 8 on which light 801 is incident, 903 in FIG. 9, 1003 in FIG. 10, and 1103 in FIGS. 11A through 11F.

FIG. 6C depicts a front-side illuminated CMOS image sensor pixel in which an optically sensitive material has been integrated in intimate contact with the silicon diode. In this embodiment the optically sensitive material is biased by the silicon substrate directly; as a result, in this embodiment, no transparent electrode is required on top. 651 depicts a silicon substrate on which the image sensor is fabricated. 653 depicts a diode formed in silicon. 655 is the metal interconnect and 657 the interlayer dielectric stack that serves to provide communication of electrical signals within and across the integrated circuit. 659 is an optically sensitive material that is the primary location for the absorption of light to be imaged. 661 points to an example region of the silicon substrate 651 that is used to provide electrical biasing of the optically sensitive material to enable photocarrier collection from it. 663 is a passivation layer that may consist of at least one of an organic or polymer encapsulant (such as parylene) or an inorganic such as Si3N4 or a stack incorporating combinations thereof. 663 serves to protect the underlying materials and circuits from environmental influences such as the impact of water or oxygen. 665 is a color filter array layer that is a spectrally-selective transmitter of light used in aid of achieving color imaging. 667 is a microlens that aids in the focusing of light onto 659 the optically sensitive material.

Figure 7A:
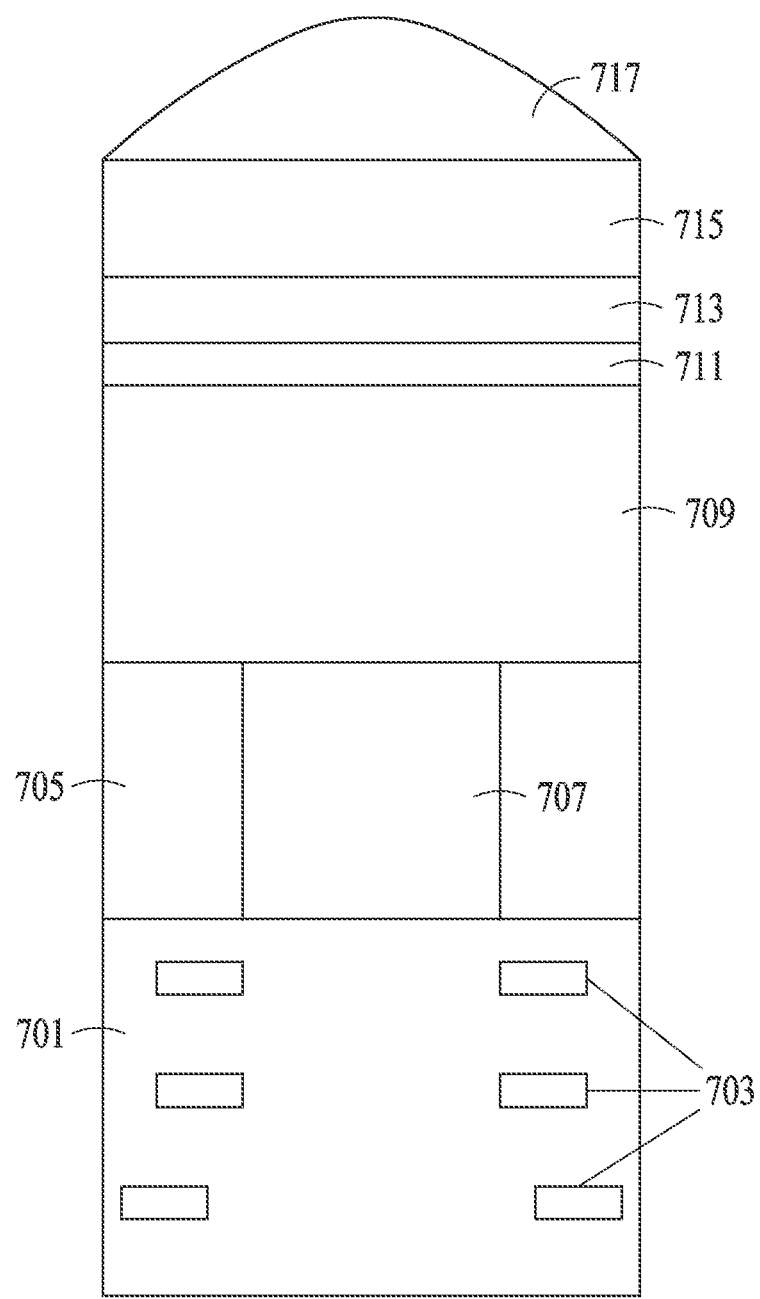
FIGS. 7A and 7B present cross-sections of a CMOS image sensor pixel in which an optically sensitive material has been integrated in intimate contact with the silicon photodiode.

FIG. 7A depicts a cross-section of a back-side illuminated CMOS image sensor pixel in which an optically sensitive material has been integrated in intimate contact with the silicon photodiode. 705 depicts a silicon substrate on which the image sensor is fabricated. 707 depicts a diode formed in silicon. 703 is the metal interconnect and 701 the interlayer dielectric stack that serves to provide communication of electrical signals within and across the integrated circuit. 709 is an optically sensitive material that is the primary location for the absorption of light to be imaged. 711 is a transparent electrode that is used to provide electrical biasing of the optically sensitive material to enable photocarrier collection from it. 713 is a passivation layer that may consist of at least one of an organic or polymer encapsulant (such as parylene) or an inorganic such as Si3N4 or a stack incorporating combinations thereof. 713 serves to protect the underlying materials and circuits from environmental influences such as the impact of water or oxygen. 715 is a color filter array layer that is a spectrally-selective transmitter of light used in aid of achieving color imaging. 717 is a microlens that aids in the focusing of light onto 709 the optically sensitive material.

Figure 7B:
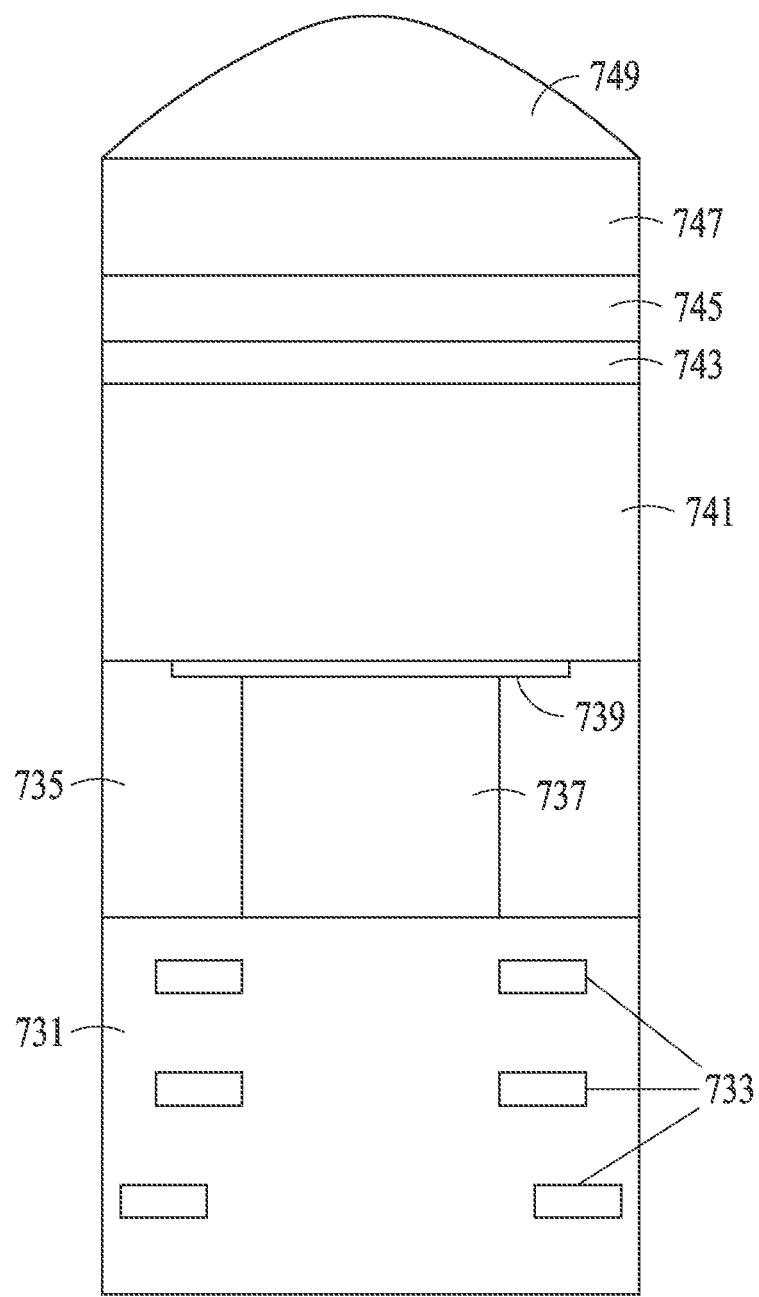

FIG. 7B depicts a cross-section of a back-side illuminated CMOS image sensor pixel in which an optically sensitive material has been integrated in intimate contact with the silicon photodiode. 735 depicts a silicon substrate on which the image sensor is fabricated. 737 depicts a diode formed in silicon. 733 is the metal interconnect and 731 the interlayer dielectric stack that serves to provide communication of electrical signals within and across the integrated circuit. 741 is an optically sensitive material that is the primary location for the absorption of light to be imaged. 743 is a transparent electrode that is used to provide electrical biasing of the optically sensitive material to enable photocarrier collection from it. 745 is a passivation layer that may consist of at least one of an organic or polymer encapsulant (such as parylene) or an inorganic such as Si3N4 or a stack incorporating combinations thereof. 745 serves to protect the underlying materials and circuits from environmental influences such as the impact of water or oxygen. 747 is a color filter array layer that is a spectrally-selective transmitter of light used in aid of achieving color imaging. 749 is a microlens that aids in the focusing of light onto '5' the optically sensitive material. 739 is a material that resides between the optically sensitive material 741 and the diode 737. 739 may be referred to as an added pinning layer. Example embodiments include a p-type silicon layer. Example embodiments include a non-metallic material such as a semiconductor and/or it could include polymer and/or organic materials. In embodiments, material 739 may provide a path having sufficient conductivity for charge to flow from the optically sensitive material to the diode, but would not be metallic interconnect. In embodiments, 739 serves to passivate the surface of the diode and create the pinned diode in this example embodiment (instead of the optically sensitive material, which would be on top of this additional layer).

Figure 8:
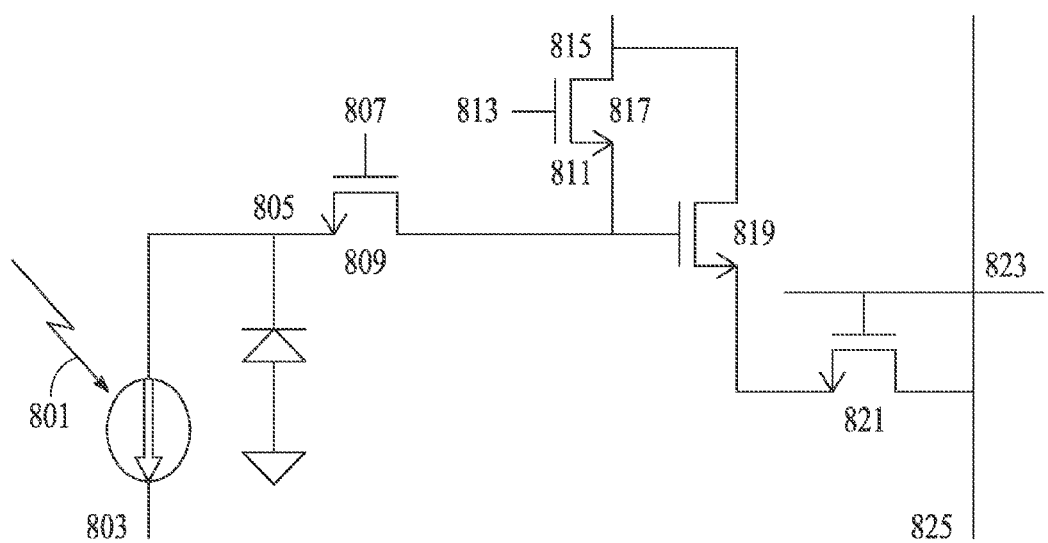
FIG. 8 is a circuit diagram showing a pixel which has been augmented with an optically sensitive material.

FIG. 8 is a circuit diagram for a back-side illuminated image sensor in which optically sensitive material is integrated to silicon chip from the back side. 801 depicts light illuminating the optically sensitive material (filled circle with downward-pointing arrow). 803 is an electrode that provides bias across the optically sensitive material. It corresponds to the top transparent electrode (711 of FIG. 7A) or to the region of the silicon substrate used to provide electrical biasing (743 of FIG. 7B). 805 is the silicon diode (corresponding to 603, 633, 653, 707, and 737 in FIGS. 6A, 6B, 6C, 7A, and 7B, respectively). 805 may also be termed the charge store. 805 may be termed the pinned diode. 807 is an electrode on the front side of silicon (metal), which ties to transistor gate of M1. 809 is the transistor M1, which separates the diode from sense node and the rest of the readout circuitry. The gate of this transistor is 807. A transfer signal is applied to this gate to transfer charge between the diode and the sense node 811. 811 is the sense node. It is separated from diode, allowing flexibility in the readout scheme. 813 is an electrode on the front side of silicon (metal), which ties to the transistor gate of M2. 815 is an electrode on the front side of silicon (metal), which ties to transistor drain of M2. 815 may be termed a reference potential. 815 can provide VDD for reset. 817 is the transistor M2, which acts as a reset device. It is used to initialize the sense node before readout. It is also used to initialize the diode before integration (when M1 and M2 are both turned on). The gate of this transistor is 813. A reset signal is applied to this gate to reset the sense node 811. 819 is transistor M3, which is used to read out the sense node voltage. 821 is transistor M4, which is used to connect the pixel to the readout bus. 823 is an electrode on the front side of silicon (metal), which ties to the gate of M4. When it is high, the pixel driving the readout bus vcol. 825 is the readout bus vcol. 801 and 803 and 805 reside within the backside of silicon. 807-825 reside within the frontside of silicon, including metal stack and transistors.

Referring to FIG. 8, the diagonal line is included to help describe the backside implementation. The transistors to the right of this line would be formed on the front side. The diode and optically sensitive material on the left would be on the back side. The diode would extend from the back side through the substrate and near to the front side. This allows a connection to be formed between the transistors on the front side to transfer charge from the diode to the sense node 811 of the pixel circuit.

Referring to FIG. 8, the pixel circuit may be defined as the set of all circuit elements in the figure, with the exception of the optically sensitive material. The pixel circuit includes the read-out circuit, the latter include a source follower transistor 819, row select transistor 821 with row select gate 823, and column read out 825.

Figure 12:
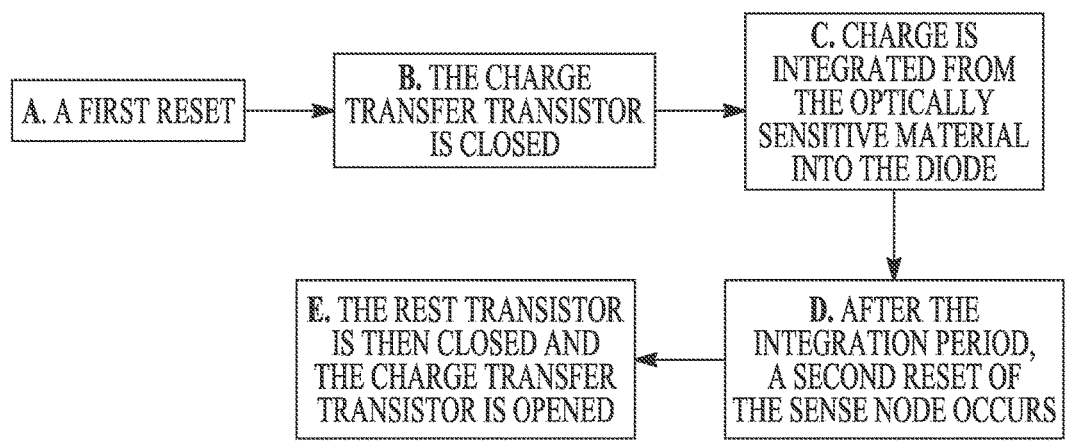
FIG. 12 is a flowchart of an operation of the pixel circuitry.

Referring to FIG. 12, in embodiments, the pixel circuit may operate in the following manner.

A first reset (FIG. 12 at "a") is performed to reset the sense node (811 from FIG. 8) and the diode (805 from FIG. 8) prior to integration. Reset transistor (817 from FIG. 8) and charge transfer transistor (809 from FIG. 8) are open during the first reset. This resets the sense node (811 from FIG. 8) to the reference potential (for example 3 Volts). The diode is pinned to a fixed voltage when it is depleted. Said fixed voltage to which the diode is pinned may be termed the depletion voltage of the diode. The reset depletes the diode which resets its voltage (for example to 1 Volt). Since it is pinned, it will not reach the same voltage level as the sense node.

The charge transfer transistor (809 from FIG. 8) is then closed (FIG. 12 at "b") to start the integration period which isolates the sense node from the diode.

Charge is integrated (FIG. 12 at "c") from the optically sensitive material into the diode during the integration period of time. The electrode that biases the optically sensitive film is at a lower voltage than the diode (for example 0 Volts) so there is a voltage difference across the material and charge integrates to the diode. The charge is integrated through a non-metallic contact region between the material and the diode. In embodiments, this is the junction between the optically sensitive material and the n-doped region of the diode. In embodiments, there may reside other non-metallic layers (such as p-type silicon) between the optically sensitive material and the diode. The interface with the optically sensitive material causes the diode to be pinned and also passivates the surface of the n-doped region by providing a hole accumulation layer. This reduces noise and dark current that would otherwise be generated by silicon oxide formed on the top surface of the diode.

After the integration period, a second reset (FIG. 12 at "d") of the sense node occurs immediately prior to read out (the reset transistor is turned on while the diode remains isolated). This provides a known starting voltage for read out and eliminates noise/leakage introduced to the sense node during the integration period. The double reset process for pixel read out is referred to as true correlated double sampling.

The reset transistor is then closed and the charge transfer transistor is opened (FIG. 12 at "e") to transfer charge from the diode to the sense node which is then read out through the source follower and column line.

Referring to FIG. 6A, the use of the sensitizing material 609 may provide shorter absorption length than silicon's across the spectra range of interest. The sensitizing material may provide absorption lengths of 1 um and shorter.

Referring to FIG. 6A, the high efficiency of photocarrier transfer from the sensitizing material 609 to a read-out integrated circuit beneath via diode 603 may be achieved.

Referring FIG. 6A, the system described may achieve a minimum of dark current and/or noise and/or photoresponse nonuniformity and/or dark current nonuniformity by integrating the optically sensitive material 609 with the silicon read-out circuit via diode 603.

Referring to FIG. 6A, examples of optically sensitive material 609 include dense thin films made of colloidal quantum dots. Constituent materials include PbS, PbSe, PbTe; CdS, CdSe, CdTe; Bi2S3, In2S3, In2Se3; SnS, SnSe, SnTe; ZnS, ZnSe, ZnTe. The nanoparticles may be in the range 1-10 nm in diameter, and may be substantially monodispersed, i.e., may possess substantially the same size and shape. The materials may include organic ligands and/or crosslinkers to aid in surface passivation and of a length and conductivity that, combined, facilitate inter-quantum-dot charge transfer.

Referring to FIG. 6A, examples of optically sensitive material 609 include thin films made of organic materials that are strongly absorptive of light in some or all wavelength ranges of interest. Constituent materials include P3HT, PCBM, PPV, MEH-PPV, and copper phthalocyanine and related metal phthalocyanines.

Referring to FIG. 6A, examples of optically sensitive material 609 include thin films made of inorganic materials such as CdTe, copper indium gallium (di)selenide (CIGS), Cu2ZnSnS4 (CZTS), or III-V type materials such as AlGaAs.

Referring to FIG. 6A, optically sensitive material 609 may be directly integrated with a diode 603 in a manner that may, among other benefits, reduce dark currents. The direct integration of the optically sensitive material 609 with the silicon diode 603 may lead to reduced dark currents associated with interface traps located on the surface of a diode. This concept may enable substantially complete transfer of charge from the diode into a floating sense node, enabling true correlated double sample operation.

Referring to FIGS. 6A, 6B, and 6C, the respective sensitizing materials 609, 641, and 659 may be integrated with, and serve to augment the sensitivity and reduce the crosstalk of, a front-side-illuminated image sensor. Electrical connection is made between the sensitizing material 609, 641, and 659 and the respective diode 603, 633, and 653.

Referring to FIGS. 7A and 7B, the respective sensitizing materials 709 and 741 may be integrated with, and serve to augment the sensitivity and reduce the crosstalk of, a backside-illuminated image sensor. Following the application and thinning of the second wafer atop a first, plus any further implants and surface treatments, a substantially planar silicon surface is presented. With this material may be integrated the sensitizing material materials 709 and 741.

The electrical biasing of the sensitizing material may be achieved substantially in the lateral or in the vertical direction.

Referring to FIG. 6A, which may be termed a substantially vertical biasing case, bias across the sensitizing material 609 is provided between the diode 603 and a top electrode 611. In this case the top electrode 611 is desired to be substantially transparent to the wavelengths of light to be sensed. Examples of materials that can be used to form top electrode 611 include MoO3, ITO, AZO, organic materials such as BPhen, and very thin layers of metals such as aluminum, silver, copper, nickel, etc.

Referring to FIG. 6B, which may be termed a substantially lateral, or coplanar, biasing case, bias across the sensitizing material 641 is provided between the diode 633 and silicon substrate electrode 639.

Referring to FIG. 6C, which may be termed partially lateral, partially vertical, biasing case, bias across the sensitizing material 659 is provided between the diode 653 and electrode 661.

Figure 9:
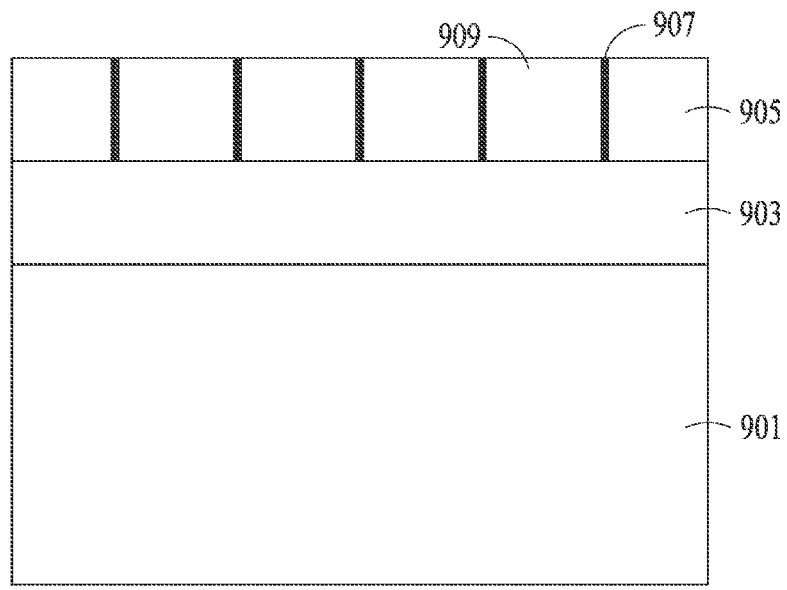
FIG. 9 is a cross-section depicting a means of reducing optical crosstalk among pixels by incorporating light-blocking layers in the color filter array or the passivation or the encapsulation or combinations thereof.

FIG. 9 depicts an image sensor device in cross-section. 901 is the substrate and may also include circuitry and metal and interlayer dielectric and top metal. 903 is a continuous photosensitive material that is contacted using metal in 901 and possibly in 905. 905 is transparent, or partially-transparent, or wavelength-selectively transparent, material on top of 903. 907 is an opaque material that ensures that light incident from the top of the device, and arriving at a non-normal angle of incidence onto region 905, is not transferred to adjacent pixels such as 909, a process that would, if it occurred, be known as optical crosstalk.

Figure 10:
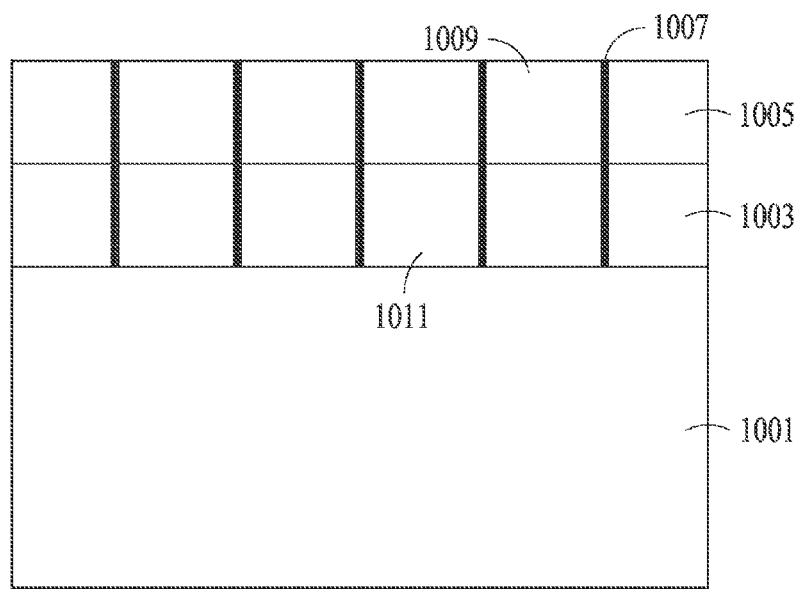
FIG. 10 is a cross-section depicting a means of reducing crosstalk among pixels by incorporating light-blocking layers in the color filter array or the passivation or the encapsulation or combinations thereof and also into the optically sensitive material.

FIG. 10 depicts an image sensor device in cross-section. 1001 is the substrate and may also include circuitry and metal and interlayer dielectric and top metal. 1003 is a photosensitive material that is contacted using metal in 1001 and possibly in 1005. 1005 is transparent, or partially-transparent, or wavelength-selectively transparent, material on top of 1003. 1007 is an opaque material that ensures that light incident from the top of the device, and arriving at a non-normal angle of incidence onto region 1005 and thence to 1003, is not transferred to adjacent pixels such as 1009 or 1011, a process that would, if it occurred, be known as optical or electrical or optical and electrical crosstalk.

Figures 11A, 11B, 11C, 11D, 11E, 11F:
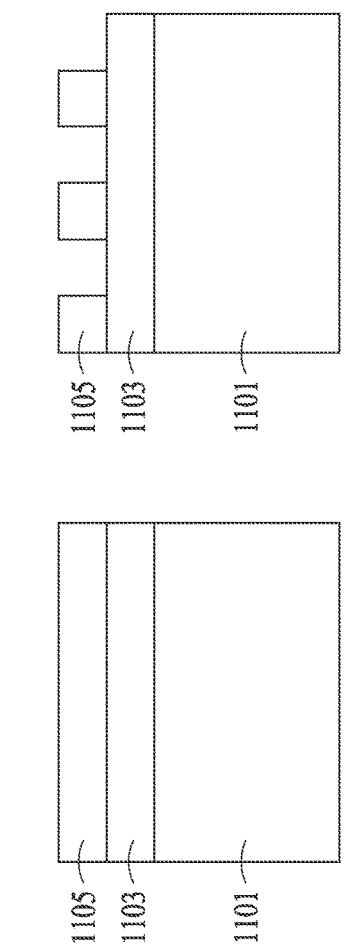
FIGS. 11A-11F are cross-sections depicting a means of fabricating an optical-crosstalk-reducing structure such as that shown in FIG. 9.

FIGS. 11A through 11F depict in cross-section a means of fabricating an optical-crosstalk-reducing structure such as that shown in FIG. 9. FIG. 11A depicts a substrate 1101 onto which is deposited an optically sensitive material 1103 and an ensuing layer or layers 1105 including as examples encapsulant, passivation material, dielectric, color filter array, microlens material, as examples. In FIG. 11B, layer 1105 has been patterned and etched in order to define pixellated regions. In FIG. 11C, a blanket of metal 1107 has been deposited over the structure shown in FIG. 11B. In FIG. 11D, the structure of FIG. 11C has been directionally etched such as to remove regions of metal from 1107 on horizontal surfaces, but leave it on vertical surfaces. The resulting vertical metal layers will provide light obscuring among adjacent pixels in the final structure. In FIG. 11E a further passivation/encapsulation/color/microlens layer or layers have been deposited 1109. In FIG. 11F, the structure has been planarized.

Referring to FIG. 9, optical cross-talk between pixels may be reduced by deposition of a thin layer 907 (e.g., 10-20 nm depending on material) of a reflective material on a sidewall of the recess of the passivation layer between photosensitive layer 903 and color filter array (top portion of 905). Since the layer 905 is deposited on the sidewall, its minimum thickness is defined only by optical properties of the material, not by minimum critical dimension of the lithography process used.

In embodiments, a thin (e.g., 5-10 nm) dielectric transparent etch stop layer is deposited as a blanket film over an optically sensitive material. A thicker (e.g., 50-200 nm) also transparent dielectric passivation layer (SiO2) is deposited over an etch stop layer. The checkerboard pattern the size of the pixel per unit is etched, the 10 nm aluminum metal layer is deposited over the topography using a conformal process (e.g., CVD, PECVD, ALD) and metal is removed from the bottom of the recessed parts of the pattern using directional (anisotropic) reactive ion plasma etch process. The recessed areas are filled with the same transparent passivation dielectric (SiO2) and overfilled to provide sufficiently thick film to allow a planarization process, for example, either using Chemical Mechanical Polishing or Back Etch. Said processes remove excess SiO2 and also residual metal film over horizontal surfaces. Similar processes can be applied for isolation of CFA or microlens layers.

Referring to FIG. 9, a vertical metal layer 907 may provide improved optical isolation between small pixels without substantial photoresponse loss.

Referring to FIG. 10, for optical isolation of pixels through the optically sensitive material 1003, the following structure and process may be employed. A hard mask protective pattern is formed on the surface of optically sensitive material using high-resolution lithography techniques such as double-exposure or imprint technology. The mask forms a grid with the minimum dimensions (for example, 22 nm or 16 nm width). Exposed photosensitive material is etched using anisotropic reactive ion plasma etch process thru all or a major part of the photosensitive layer. The formed recess is filled with, for example, a) one or more dielectric materials with the required refractive index to provide complete internal reflection of photons back into the pixel or b) exposed photosensitive material is oxidized to form an electrical isolation layer about 1-5 nm thick on sidewalls of the recess and the remaining free space is filled with the reflective metal material such as aluminum using, for example, conventional vacuum metallization processes. The residual metal on the surface of photosensitive material is removed either by wet or dry etching or by mechanical polishing.

What is claimed:
1. An image sensor comprising:
a semiconductor substrate;
a plurality of pixel regions, each pixel region comprising an optically sensitive material over the substrate, the optically sensitive material positioned to receive light;

a pixel circuit for each pixel region, each pixel circuit comprising a charge store formed on the semiconductor substrate and a read out circuit; and a non-metallic contact region between the charge store and the optically sensitive material of the respective pixel region, the charge store being in electrical communication with the optically sensitive material of the respective pixel region through the non-metallic contact region, the optically sensitive layer being configured to substantially shield the charge store from light incident on the optically sensitive layer, the non-metallic contact region comprising a heterojunction.

2. The image sensor of claim 1, wherein the charge store comprises a doped region of the semiconductor substrate.

3. The image sensor of claim 1, wherein the charge store comprises an n-type region of the semiconductor substrate.

4. The image sensor of claim 1, wherein the charge store comprises a diode.

5. The image sensor of claim 1, wherein the charge store comprises a n-type silicon diode.

6. The image sensor of claim 1, wherein the charge store comprises a pinned diode.

7. The image sensor of claim 6, wherein the pinned diode comprises a p-type layer of the optically sensitive material over an n-type region of the semiconductor substrate.

8. The image sensor of claim 1, wherein the optically sensitive material comprises a p-type semiconductor material.

9. The image sensor of claim 1, wherein the non-metallic contact region comprises a pn junction.

10. The image sensor of claim 1, wherein the optically sensitive material is in direct electrical communication with the charge store.

11. The image sensor of claim 1, wherein the optically sensitive material is in direct contact with the charge store.

12. The image sensor of claim 1, wherein the optically sensitive material forms a passivation layer over the charge store.

13. The image sensor of claim 1, wherein the optically sensitive material forms a hole accumulation layer over the charge store.

14. The image sensor of claim 1, wherein the charge store comprises a pinned diode, and the pinned diode comprises a p-type layer of the optically sensitive material over an n-type region of the semiconductor substrate.

15. The image sensor of claim 1, wherein the optically sensitive material absorbs light at a wavelength being imaged.

16. The image sensor of claim 1, wherein the non-metallic contact region comprises at least one layer of material between the optically sensitive material and the charge store.

17. The image sensor of claim 16, wherein at least one layer of the at least one layer of material comprises a p-type semiconductor material.

18. The image sensor of claim 16, wherein at least one layer of the at least one layer of material comprises a p-type silicon layer.

19. The image sensor of claim 16, wherein at least one layer of the at least one layer of material comprises at least one material selected from a group of materials consisting of a semiconductor material, a polymer material, and an organic material.

20. The image sensor of claim 16, wherein at least one layer of the at least one layer of material provides a non-metallic conductive path for a flow of charge between the optically sensitive material and the charge store.

* * * * *